US006376301B2

(12) United States Patent
Parekh et al.

(10) Patent No.: US 6,376,301 B2
(45) Date of Patent: *Apr. 23, 2002

(54) METHODS OF FORMING A CAPACITOR AND METHODS OF FORMING A MONOLITHIC INTEGRATED CIRCUIT

(75) Inventors: Kunal R. Parekh; John K. Zahurak, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/120,045

(22) Filed: Jul. 21, 1998

Related U.S. Application Data

(62) Division of application No. 08/798,879, filed on Feb. 11, 1997, now Pat. No. 5,981,333.

(51) Int. Cl.$^7$ .......................................... H01L 21/8242
(52) U.S. Cl. ....................................... 438/253; 438/255
(58) Field of Search ................................ 438/253–256, 438/396–399

(56) References Cited

U.S. PATENT DOCUMENTS

| 4,845,537 A | 7/1989 | Nishimura et al. ......... 257/302 |
| 4,864,374 A | 9/1989 | Banerjee ..................... 257/302 |

(List continued on next page.)

OTHER PUBLICATIONS

U.S. application No. 08/394,546, Jost et al., filed Feb. 22, 1995.

Sakao, M., "A Capacitor–Over–Bit–Line (COB) Cell With A Hemispherical–Grain Storage Node For 64Mb DRAMs", 1990 IEEE, pp. 27.3.1–27.3.4.

Aoki, M., et. al., "Fully Self–Aligned 6F$^2$ Cell Technology For Low Cost 1Gb DRAM", 1996 IEEE, pp. 22–23.

IBM Technical Disclosure Bulletin, "Methods of Forming Small Contact Holes", vol. 30, No. 8 (Jan. 1988), pp. 252–253.

Hayden, J.D., et. al., "A New Toroidal TFT Structure For Future Generation SRAMs", IEEE 1993, pp. 825–828, IEDM.

*Primary Examiner*—Jey Tsai
(74) *Attorney, Agent, or Firm*—Well St. John P.S.

(57) ABSTRACT

The invention encompasses methods of forming DRAM constructions, methods of forming capacitor constructions, DRAM constructions, and capacitor constructions. The invention includes a method in which a) a first layer is formed over a node location; b) a semiconductive material masking layer is formed over the first layer; c) an opening is formed through the semiconductive material masking layer and the first layer to the node location; d) an upwardly open capacitor storage node layer is formed within the opening; e) a storage node is formed from the masking layer and the storage node layer; and f) a capacitor dielectric layer and a capacitor plate are formed over the storage node. The invention also includes a capacitor structure comprising: a) an insulative layer over a substrate; b) a polysilicon layer over the insulative layer; c) an opening extending through the polysilicon layer and the insulative layer to a node, the opening comprising an upper portion and a lower portion, the upper portion comprising a first minimum cross-sectional dimension and the lower portion comprising a second minimum cross-sectional dimension which is narrower than the first minimum cross-sectional dimension, the opening further comprising a step at an interface of the upper and lower portions; d) a spacer over the step; e) a storage node layer over the spacer, polysilicon layer and the node; and f) a dielectric layer and a cell plate layer capacitively coupled to the storage node layer.

14 Claims, 25 Drawing Sheets

U.S. PATENT DOCUMENTS

| | | | |
|---|---|---|---|
| 5,170,233 A | 12/1992 | Liu et al. | 257/308 |
| 5,206,183 A | 4/1993 | Dennison | 437/47 |
| 5,227,325 A | 7/1993 | Gonzalez | 437/52 |
| 5,229,310 A | 7/1993 | Sivan | 437/41 TFT |
| 5,229,326 A | 7/1993 | Dennison et al. | 437/195 |
| 5,244,826 A | 9/1993 | Gonzalez et al. | 437/60 |
| 5,270,968 A | 12/1993 | Kim et al. | 437/41 TFT |
| 5,283,455 A | 2/1994 | Inoue et al. | 257/329 |
| 5,318,927 A | 6/1994 | Sandhu et al. | |
| 5,323,038 A | 6/1994 | Gonzalez et al. | 257/308 |
| 5,334,862 A | 8/1994 | Manning et al. | 437/40 TFT |
| 5,338,700 A | 8/1994 | Dennison et al. | |
| 5,385,858 A | 1/1995 | Manabe | 437/52 |
| 5,391,511 A | 2/1995 | Doan et al. | |
| 5,401,681 A | 3/1995 | Dennison | |
| 5,438,011 A | 8/1995 | Blalock et al. | |
| 5,444,013 A | 8/1995 | Akram et al. | 437/60 |
| 5,482,886 A | 1/1996 | Park et al. | |
| 5,498,562 A | 3/1996 | Dennison et al. | |
| 5,508,218 A * | 4/1996 | Jun | |
| 5,543,345 A | 8/1996 | Liaw et al. | |
| 5,563,089 A | 10/1996 | Jost et al. | |
| 5,604,147 A | 2/1997 | Fischer et al. | |
| 5,661,064 A | 8/1997 | Figura et al. | |
| 5,700,731 A | 12/1997 | Lin et al. | |
| 5,714,780 A * | 2/1998 | Jun | 257/306 |
| 5,786,249 A | 7/1998 | Dennison | |
| 6,083,831 A | 7/2000 | Dennison | |
| 6,218,237 B1 | 4/2001 | Sandhu et al. | |

\* cited by examiner

METHODS OF FORMING A CAPACITOR AND METHODS OF FORMING A MONOLITHIC INTEGRATED CIRCUIT

RELATED PATENT DATA

This patent application resulted from a divisional application of U.S. patent application Ser. No. 08/798,879, U.S. Pat. No. 5,981,333 filed Feb. 11, 1997, entitled "Methods of Forming Capacitor Structures, DRAM Cells and Integrated Circuitry", naming Kunal R. Parekh and John K. Zahurak as inventors, the disclosure of which is incorporated by reference.

TECHNICAL FIELD

This invention pertains to semiconductor capacitor constructions and to methods of forming semiconductor capacitor constructions. The invention is thought to have particular significance in application to methods of forming dynamic random access memory (DRAM) cell structures and to DRAM cell structures.

BACKGROUND OF THE INVENTION

A commonly used semiconductor memory device is a DRAM cell. A DRAM cell generally consists of a capacitor coupled through a transistor to a bitline. A continuous challenge in the semiconductor industry is to increase DRAM circuit density. Accordingly, there is a continuous effort to decrease the size of memory cell components. A limitation on the minimal size of cell components is impacted by the resolution of a photolithographic etch during fabrication of the components. Although this resolution is generally improving, at any given time there is a minimum photolithographic feature dimension obtainable in a fabrication process. It would be desirable to form DRAM components having at least some portion with a cross-sectional dimension of less than a given minimum capable photolithographic feature dimension.

Another continuous trend in the semiconductor industry is to minimize processing steps. Accordingly, it is desirable to utilize common steps for the formation of separate DRAM components. For instance, it is desirable to utilize common steps for the formation of DRAM capacitor structures and DRAM bitline contacts.

SUMMARY OF THE INVENTION

The invention includes a number of methods and structures pertaining to semiconductor circuit technology, including: methods of forming DRAM memory cell constructions; methods of forming capacitor constructions; methods of forming capacitor and bitline constructions; DRAM memory cell constructions; and capacitor constructions. For instance, the invention encompasses a method wherein a first layer is formed over a node location; a semiconductive material masking layer is formed over the first layer; an opening is etched through the semiconductive material masking layer and first layer to the node location; an upwardly open capacitor storage node layer is formed within the opening and in electrical connection with the masking layer; a capacitor storage node is formed comprising the masking layer and the storage node layer; and a capacitor dielectric layer and outer capacitor plate are formed over the capacitor storage node.

As another example, the invention encompasses a capacitor structure which includes an insulative layer over a substrate and a semiconductive material layer over the insulative layer. The capacitor structure further includes an opening which extends through the semiconductive material layer and the insulative layer to an electrical node, and which comprises an upper portion and a lower portion, the upper portion comprising a first minimum cross-sectional dimension and the lower portion comprising a second minimum cross-sectional dimension which is narrower than the first minimum cross-sectional dimension, the opening further comprising a step at an interface of the upper and lower portions. The capacitor further comprises a spacer over the step, and a storage node layer over the spacer, semiconductive material layer and electrical node; wherein the storage node layer physically contacts the semiconductive material layer, the spacer, and the electrical node. Additionally, the capacitor comprises a dielectric layer and a cell plate layer capacitively coupled to the storage node layer.

BRIEF DESCRIPTION OF THE DRAWINGS

Preferred embodiments of the invention are described below with reference to the following accompanying drawings.

FIG. 14 is a view of the FIG. 1 wafer fragment at a processing step subsequent to that of FIG. 13.

DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of forming DRAM cells of the present invention is described with reference to FIGS. 1–25, with FIGS. 1–14 pertaining to a first embodiment of the invention, FIGS. 15–16 pertaining to a second embodiment of the invention, FIGS. 17–22 pertaining to a third embodiment of the invention, and FIGS. 23–25 pertaining to a fourth embodiment of the invention.

Figure 1:
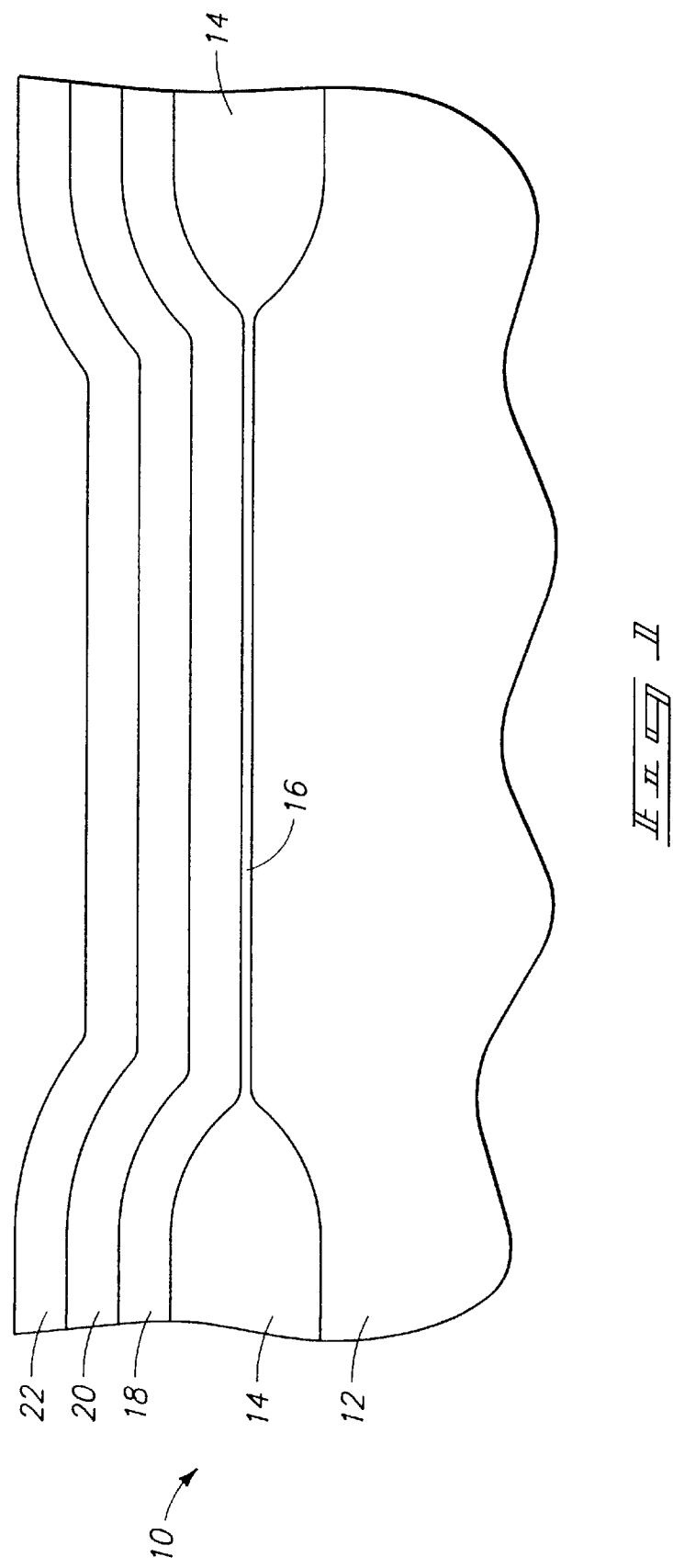
FIG. 1 is a schematic cross-sectional process view of a semiconductor wafer fragment at a preliminary step of a processing method in accordance with a method of the present invention.

Referring first to FIG. 1, a semiconductor wafer fragment 10 is illustrated at a preliminary step of a processing sequence of a method of the present invention. Wafer fragment 10 comprises a semiconductive material 12, field oxide regions 14, and a thin gate oxide layer 16. A polysilicon layer 18, silicide layer 20 and silicon oxide layer 22 are formed over gate oxide layer 16. Silicide layer 20 comprises a refractory metal silicide, such as tungsten silicide, and polysilicon layer 18 typically comprises polysilicon doped with a conductivity enhancing dopant.

Figure 2:
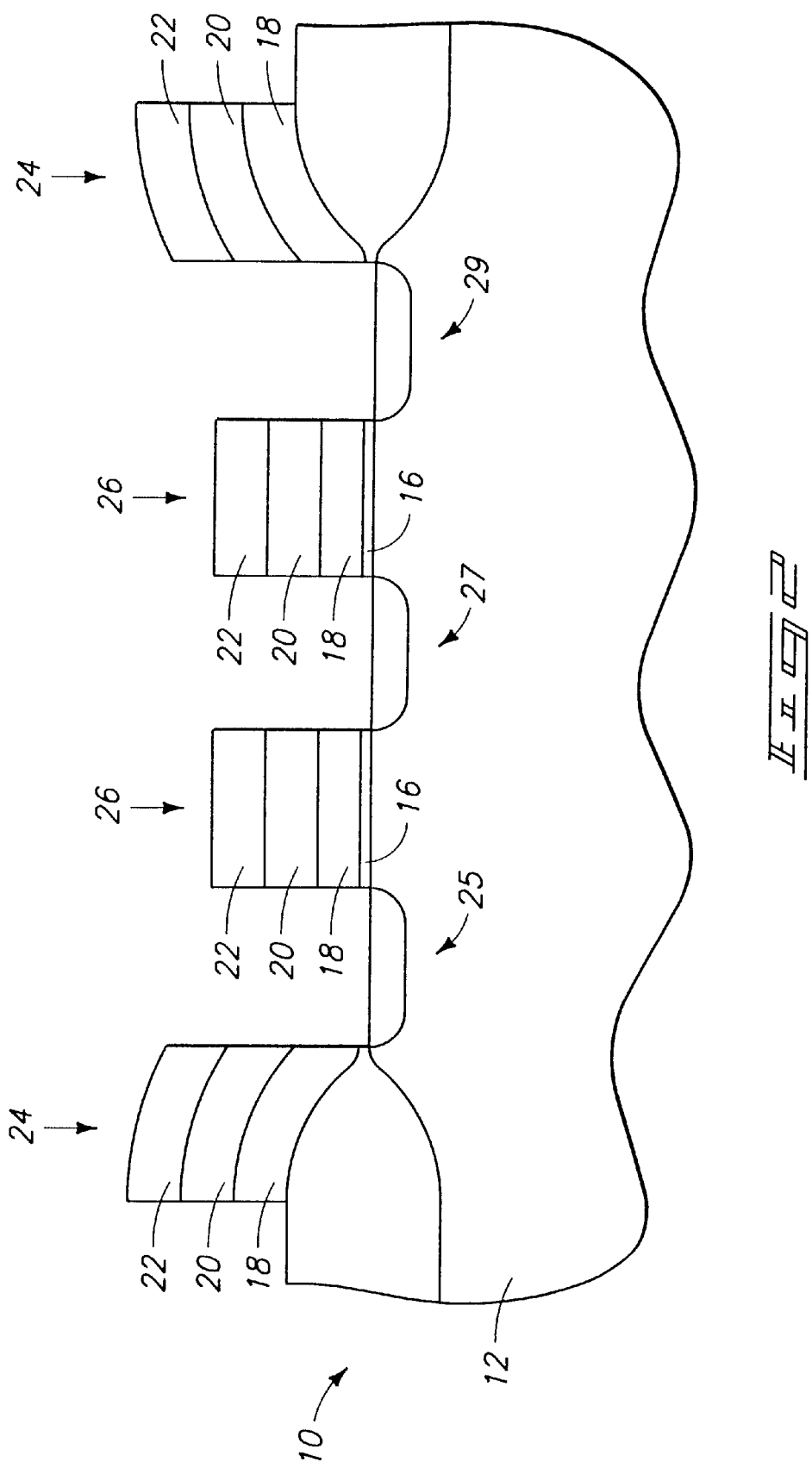
FIG. 2 is a view of the FIG. 1 wafer fragment at a processing step subsequent to that of FIG. 1.

Referring next to FIG. 2, polysilicon layer 18, silicide layer 20 and silicon oxide layer 22 are etched to form wordlines 24 and 26. Between wordlines 24 and 26 are defined node locations 25, 27 and 29, with wordlines 26 comprising transistor gates which electrically connect node locations 25, 27, and 29. Node location 27 is laterally between node locations 25 and 29, and may lie along an imaginary straight line extending between node locations 25 and 29, or may be offset from such imaginary straight line. Node locations 25, 27 and 29 typically comprise diffusion regions formed within semiconductive material 12 by ion implanting conductivity enhancing dopant into the material 12. Such ion implanting may occur after patterning wordlines 24 and 26, utilizing wordlines 24 and 26 as masks. Alternatively, the diffusion regions may be formed prior to deposition of one or more of layers 18, 20 and 22 (shown in FIG. 1). In yet other alternative methods, the diffusion regions may be formed after formation of doped polysilicon adjacent the regions by out-diffusion of conductivity enhancing dopant from the doped polysilicon.

For the above-discussed reasons, node locations 25, 27, and 29 need not be electrically conductive at the preliminary step of FIG. 2. Nodes 25, 27 and 29 could be conductive at the step of FIG. 2 if formed by ion implanting of dopant into semiconductive material 12. Alternatively, nodes 25, 27 and 29 may be substantially non-conductive at the preliminary step of FIG. 2 in, for-example, embodiments in which nodes 25, 27 and 29 are ultimately doped by out-diffusion of dopant from a conductively doped layer.

Figure 3:
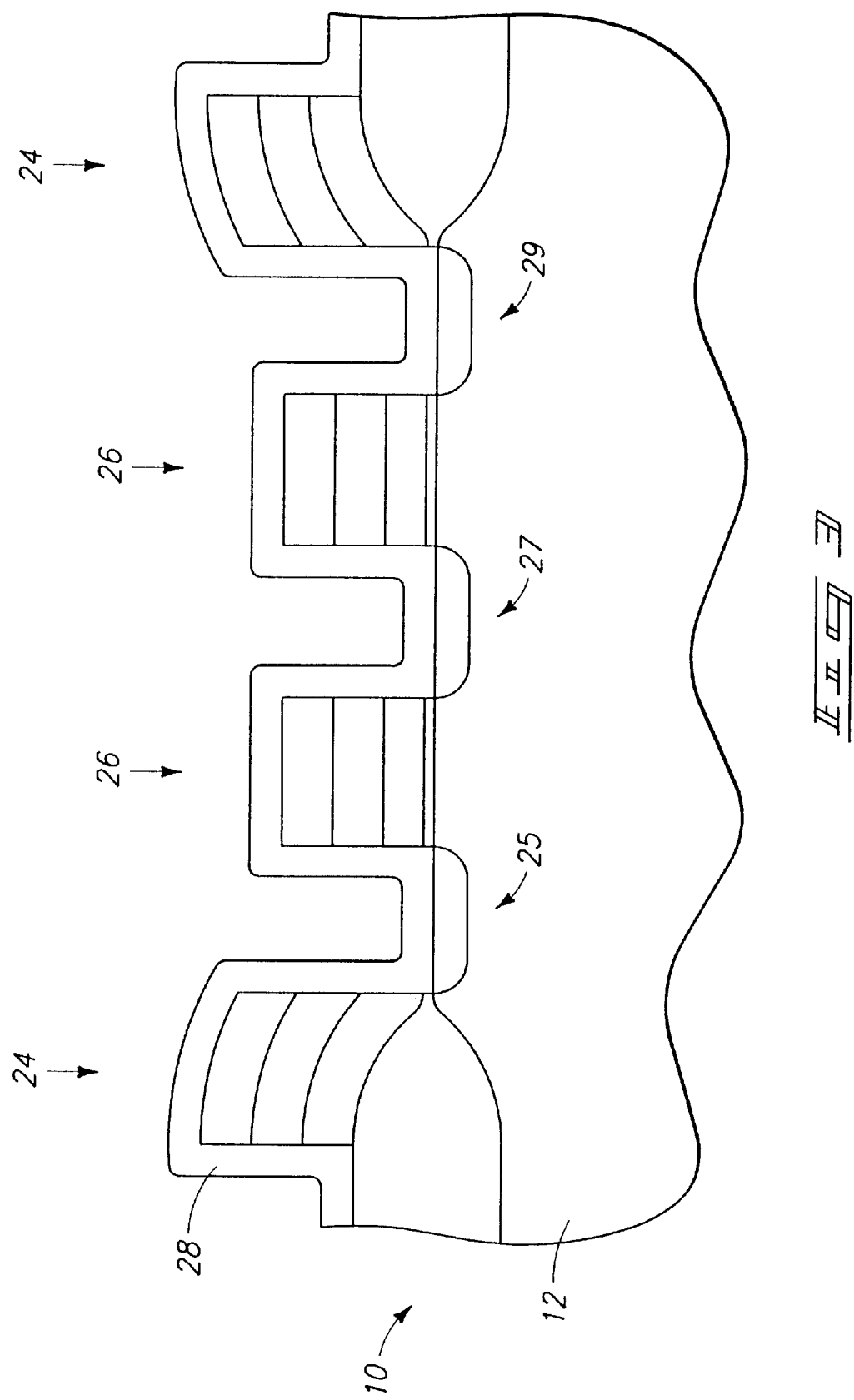
FIG. 3 is a view of the FIG. 1 wafer fragment at a processing step subsequent to that of FIG. 2.
Figure 4:
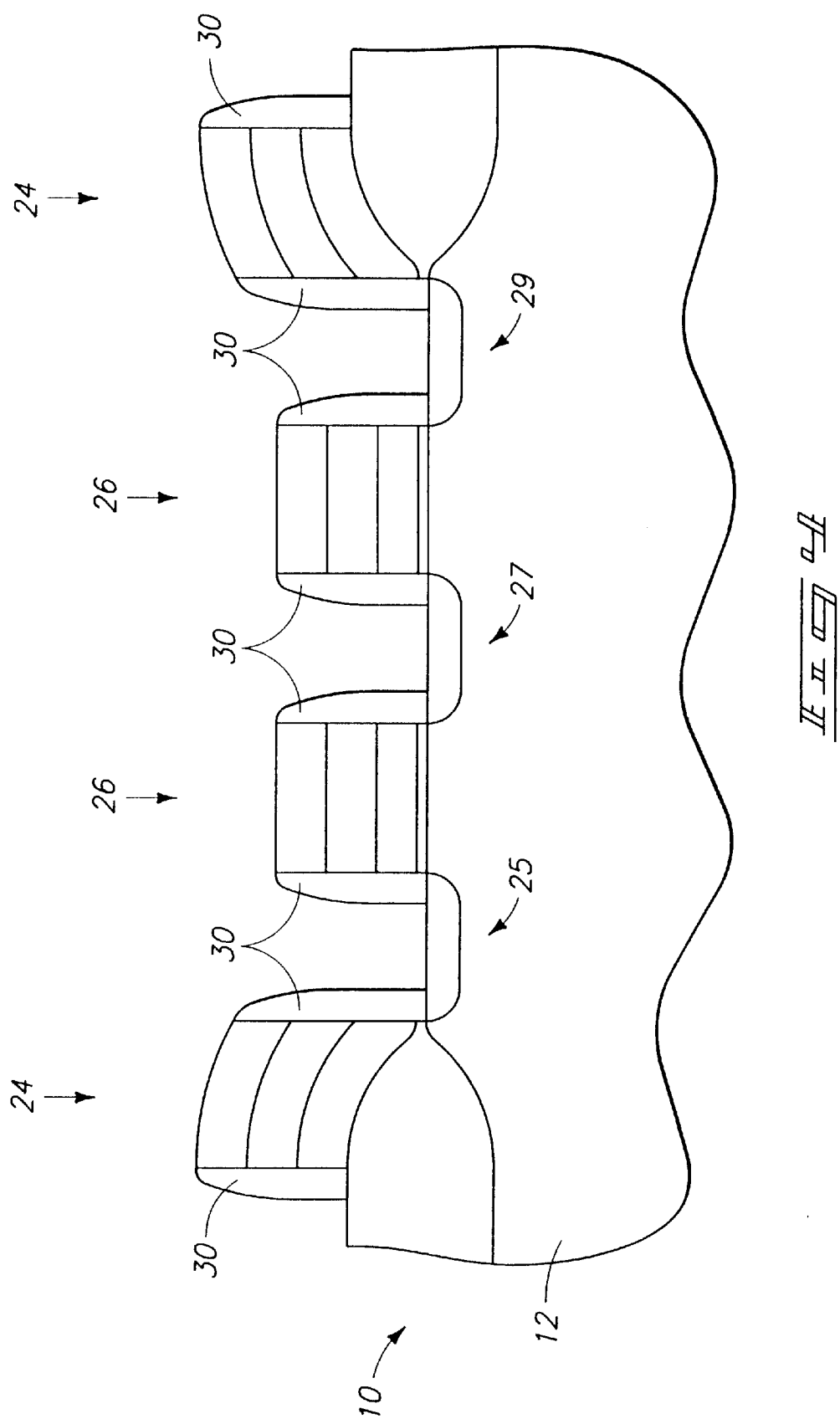
FIG. 4 is a view of the FIG. 1 wafer fragment at a processing step subsequent to that of FIG. 3.

Referring to FIGS. 3 and 4, a nitride layer 28 is provided over wordlines 24 and 26, and subsequently etched to form nitride spacers 30 laterally adjacent wordlines 24 and 26.

Figure 5:
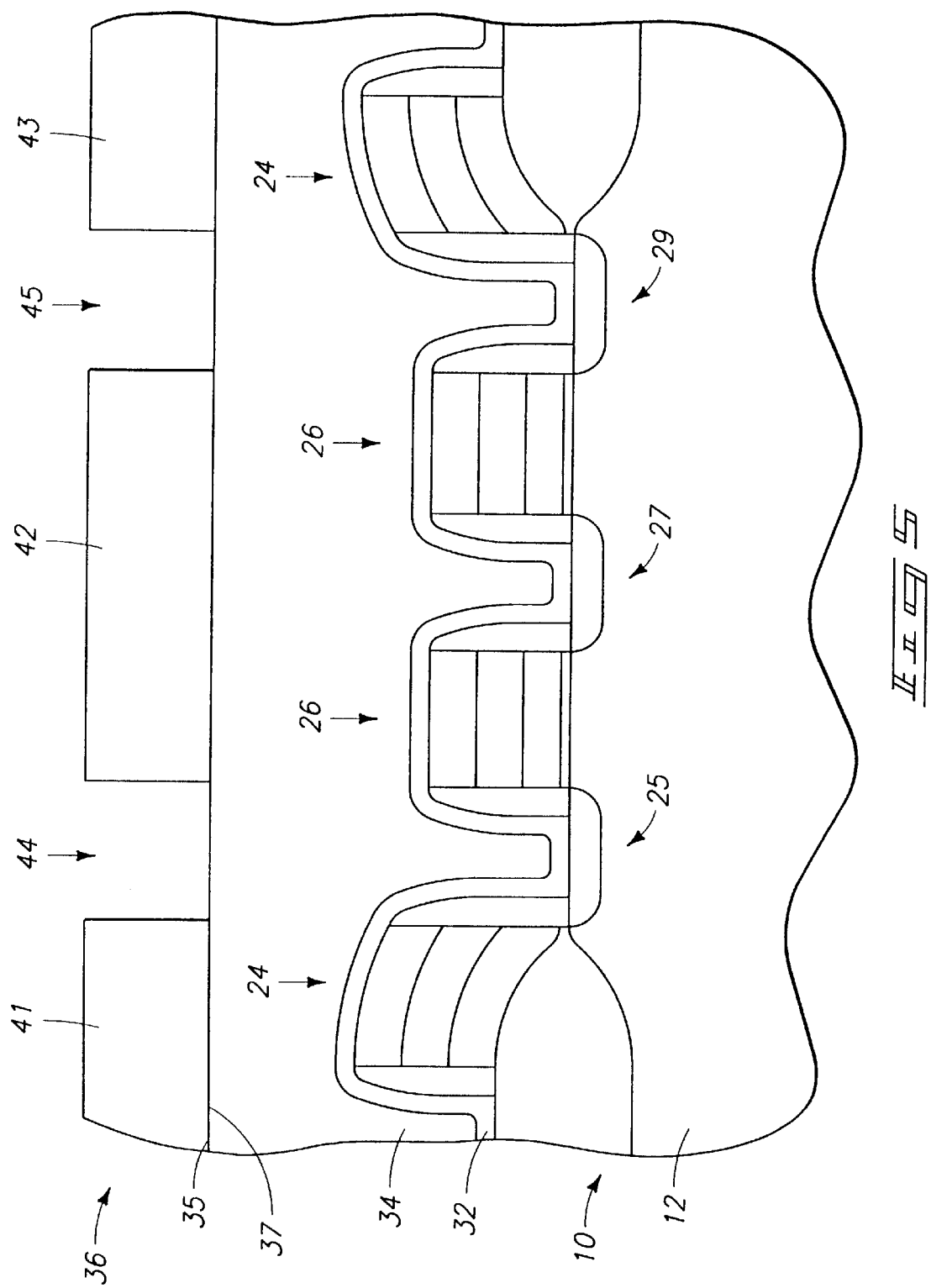
FIG. 5 is a view of the FIG. 1 wafer fragment at a processing step subsequent to that of FIG. 4.

Referring to FIG. 5, an overlying oxide layer 32 is provided over wordlines 24 and gates 26, and subsequently a borophosphosilicate glass (BPSG) layer 34 is provided over oxide layer 32. Oxide layer 32 functions to prevent the diffusion of phosphorus from the BPSG into underlying materials. As is readily apparent to persons of ordinary skill in the art, other insulative materials may be substituted for the BPSG of layer 34. If such other insulative materials are substituted, it may be desirable to dispense with formation of oxide layer 32.

BPSG layer 34 is planarized by, for example, chemical-mechanical polishing to form a planar upper surface 35. After the planarization of BPSG layer 34, a semiconductive material masking layer 36 is provided over BPSG layer 34, with masking layer 36 comprising a bottom surface 37 adjacent upper surface 35. Preferably, masking layer 36 will comprise undoped polysilicon deposited to a thickness of from about 6000 Angstroms to about 8000 Angstroms. Formation of patterned polysilicon layer 36 may comprise, for example, provision of a patterned photoresist layer over an unpatterned polysilicon layer, followed by a conventional etch of the polysilicon to transfer a pattern from the patterned photoresist layer to the polysilicon. In the shown cross-sectional view, masking layer 36 comprises masking layer segments 41, 42 and 43, with segment 42 laterally between segments 41 and 43. Gaps 44 and 45 are between segments 41 and 42, and 42 and 43, respectively. Gaps 44 and 45 overlie nodes 25 and 29, while segment 42 overlies node 27.

Figure 6:
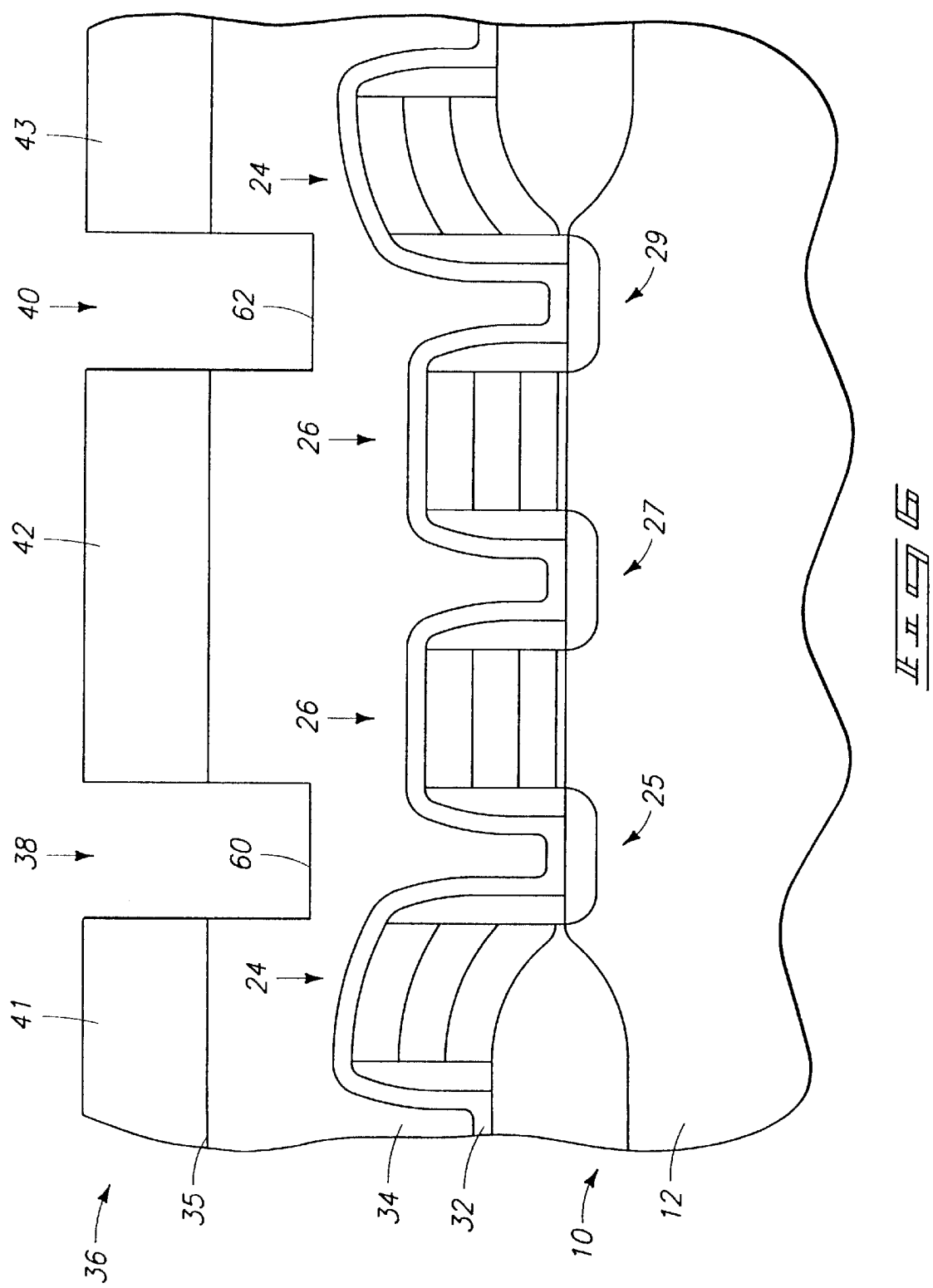
FIG. 6 is a view of the FIG. 1 wafer fragment at a processing step subsequent to that of FIG. 5.

Referring to FIG. 6, first and second openings 38 and 40 are etched through gaps 44 and 45 (shown in FIG. 5), respectively, and into BPSG layer 34, typically using a timed anisotropic dry etch. Openings 38 and 40 comprise bases 60 and 62, respectively, which are preferably above nodes 25 and 29. Accordingly, openings 38 and 40 preferably do not extend to nodes 25 and 29.

Figure 7:
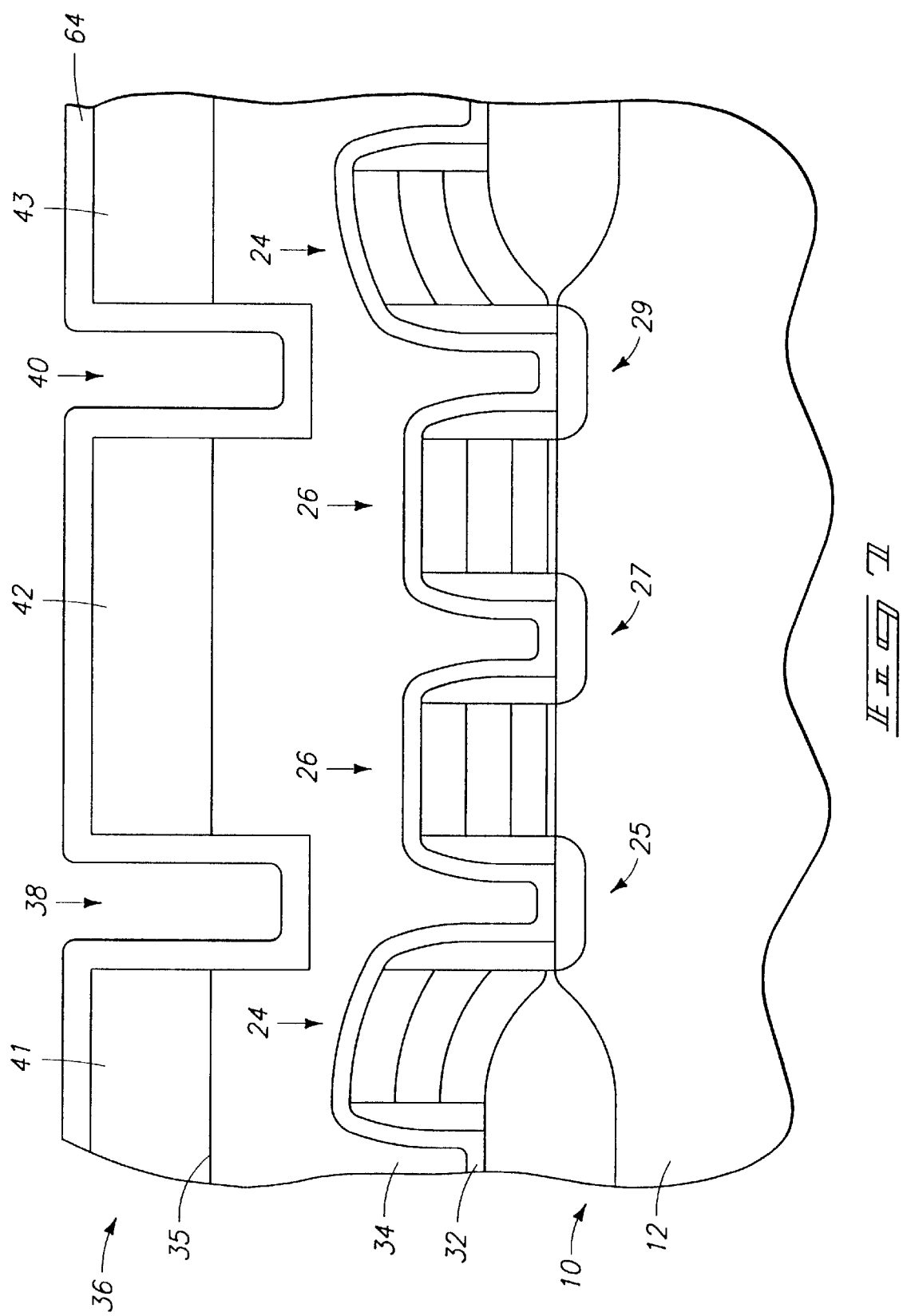
FIG. 7 is a view of the FIG. 1 wafer fragment at a processing step subsequent to that of FIG. 6.

Referring to FIG. 7, a layer 64 is provided over segments 42 and within openings 38 and 40. Layer 64 is provided to a thickness which less than completely fills openings 38 and 40. Layer 64 thus narrows openings 38 and 40. Preferably, openings 38 and 40 will comprise a minimum internal dimension approximately equal to the minimum photolithographic feature dimension obtainable during fabrication of the openings. Accordingly, after formation of layer 64, openings 38 and 40 will be narrowed to comprise an internal dimension less than such minimum capable photolithographic feature dimension.

Layer 64 may comprise either an insulative material or a conductive material. A preferred material is the insulative material silicon oxide. An example method for forming a silicon oxide layer 64 is chemical vapor deposition utilizing tetraethylorthosilicate (TEOS).

Figure 8:
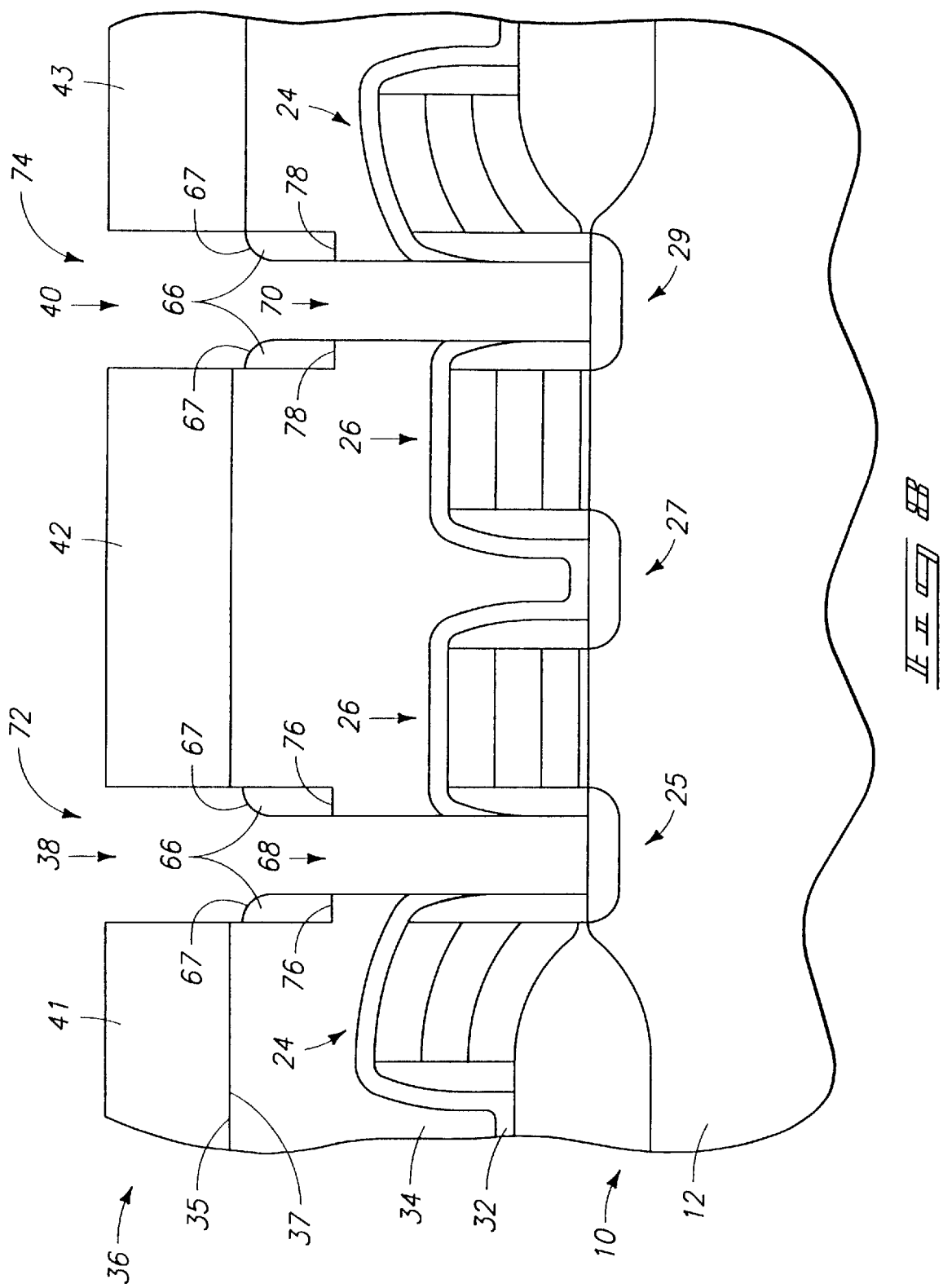
FIG. 8 is a view of the FIG. 1 wafer fragment at a processing step subsequent to that of FIG. 7.

Referring to FIG. 8, layer 64 is anisotropically etched to leave spacers 66 within openings 38 and 40. Methods for anisotropically etching layer 64 are known to persons of ordinary skill in the art. An example method for anisotropically etching the preferred silicon oxide layer 64 includes a fluorocarbon-based dry etch.

Spacers 66 comprise upper surfaces 67. In the shown preferred embodiment, upper surfaces 67 are below bottom surfaces 37 of segments 42. As will be recognized by persons of ordinary skill in the art, the location of upper surface 67 relative to bottom surface 37 may be adjusted by varying a number of parameters, including: 1) the thickness of layer 64 (shown in FIG. 7); 2) the length of time of the anisotropic etch used to etch layer 64; and 3) the depth of openings 38 and 40.

After formation of spacers 66, third and fourth openings 68 and 70, respectively, are formed by appropriate anisotropic etching. Third opening 68 extends from base 60 (shown in FIG. 6) of first opening 38 to electrical node 25. Fourth opening 70 extends from base 62 (shown in FIG. 6) of second opening 40 to electrical node 29. Openings 68 and 70 comprise internal cross-sectional dimensions about equal to the narrowed cross-sectional dimensions of openings 38 and 40 resulting after deposition of layer 64 (shown in FIG. 7). Openings 68 and 70 are therefore narrower than openings 38 and 40.

First opening 38 and third opening 68 together comprise a first capacitor opening 72. Similarly, second opening 40 and fourth opening 70 together comprise a second capacitor opening 74.

Referring to first capacitor opening 72, the opening comprises a step 76 at the interface of first opening 38 and third opening 68, with step 76 corresponding to a remaining portion of base 60 (shown in FIG. 6) of original opening 38. In the lateral cross-sectional view of FIG. 8, it appears that there are a pair of laterally opposing steps 76 within opening 72. In some embodiments of the invention, there may be distinct laterally opposing steps 76 within opening 38. However, in preferred embodiments of the invention, opening 38 will comprise a circular horizontal cross-sectional shape. In such preferred embodiments, the apparent laterally opposing steps 76 will, in fact, be sections of a continuous step 76 within opening 38.

Referring to second capacitor opening 74, this opening, analogously to first capacitor opening 72, comprises a step 78 at an interface of second opening 40 and fourth opening 70, with step 78 corresponding to base 62 (shown in FIG. 6) of original opening 40.

Spacers 66 within capacitor openings 72 and 74 are atop steps 76 and 78, respectively.

Figure 9:
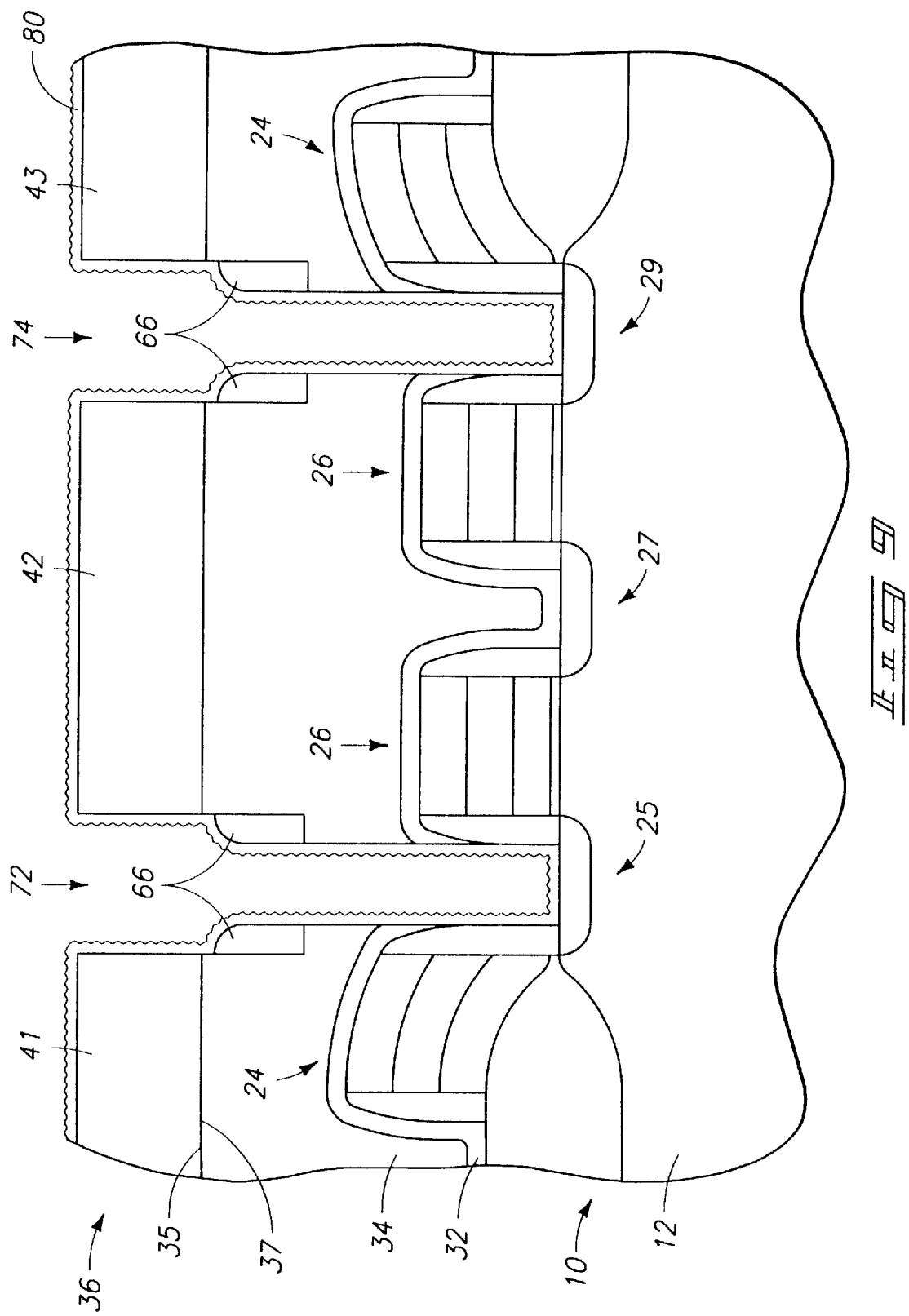
FIG. 9 is a view of the FIG. 1 wafer fragment at a processing step subsequent to that of FIG. 8.

Referring to FIG. 9, a storage node layer 80 is provided over masking layer 36, within capacitor openings 72 and 74, and in contact with segments 41, 42 and 43. Storage node layer 80 preferably comprises a rugged polysilicon, such as a polysilicon selected from the group consisting of hemispherical grain polysilicon and cylindrical grain polysilicon, and is preferably provided to a thickness of from about 300 Angstroms to about 700 Angstroms.

Figure 10:
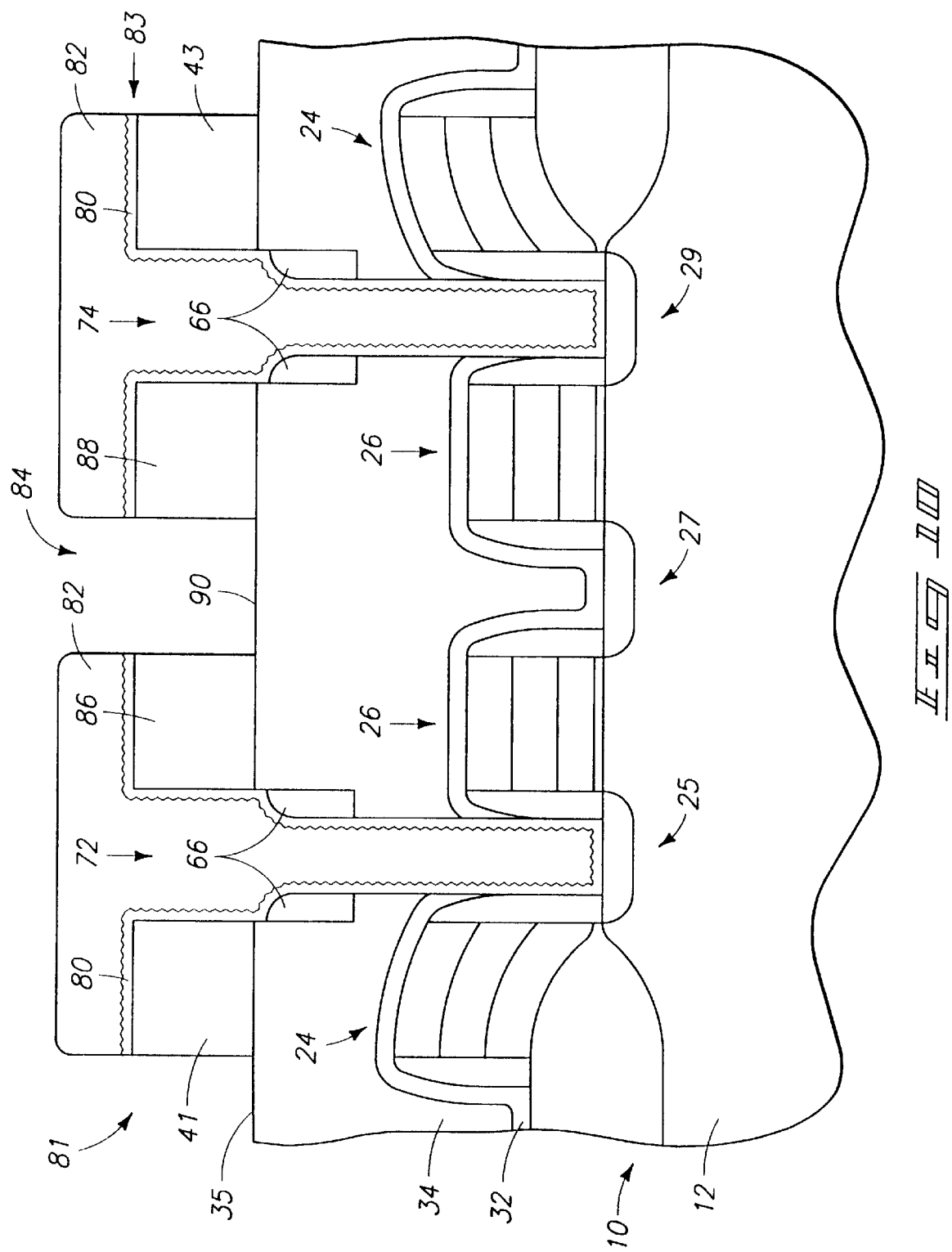
FIG. 10 is a view of the FIG. 1 wafer fragment at a processing step subsequent to that of FIG. 9.

Referring to FIG. 10, a patterned photoresist layer 82 is provided over capacitor openings 72 and 74, and over portions of masking layer segments 42, leaving exposed portions of the masking layer segments (not shown). Subsequently, the exposed portions are removed. Removal of an exposed portion of segment 42 (shown in FIG. 9) forms a fifth opening 84 over node 27. Fifth opening 84 divides segment 42 (shown in FIG. 9) into a first portion 86 and a second portion 88. Opening 84 comprises a base 90 above node 27.

Adjacent opening 84 are defined two storage nodes 81 and 83. First storage node 81 comprises storage node layer 80, segment 41 and portion 86. Second storage node 83 comprises storage node layer 80, segment 43 and portion 88. Also, as storage node layer 80 overlies and contacts spacers 66, storage nodes 81 and 83 may comprise spacers 66, particularly if spacers 66 comprise electrically conductive material. Preferably, if spacers 66 are incorporated into storage nodes 81 and 83, spacers 66 will be electrically isolated from wordlines 24 and 26.

As discussed above, segment 42 (shown in FIG. 9) will preferably comprise polysilicon. Methods of etching such preferred segments are known to persons of ordinary skill in the art, and comprise, for example, anisotropic dry etching.

Figure 11:
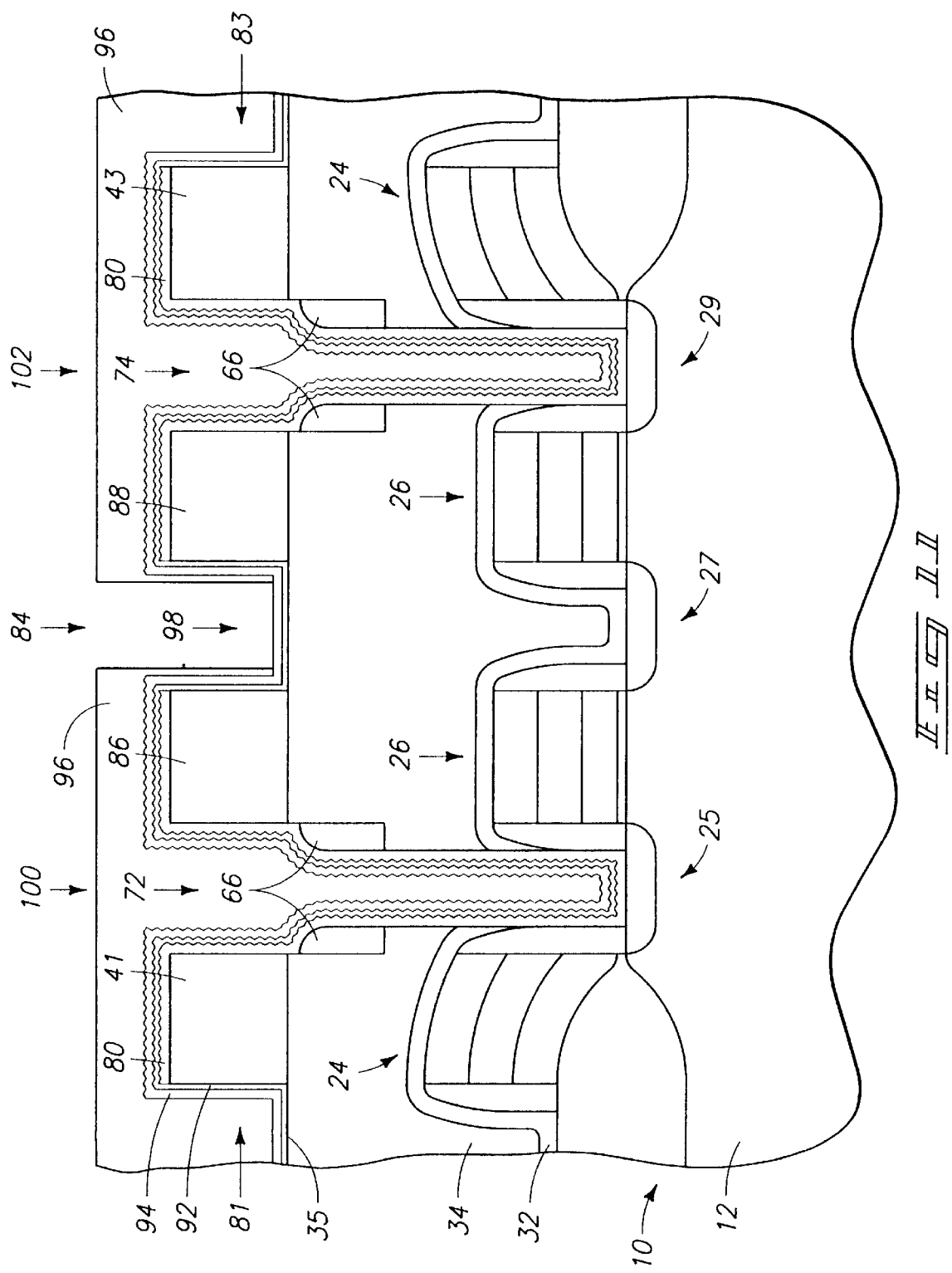
FIG. 11 is a view of the FIG. 1 wafer fragment at a processing step subsequent to that of FIG. 10.

Referring to FIG. 11, a capacitor-dielectric layer 92 and a cell plate layer 94 are provided over segments 41 and 43, over portions 81 and 83, and within capacitor openings 72 and 74. Dielectric layer 92 comprises an electrically insulative material, such as silicon nitride or a composite of silicon nitride and silicon dioxide. Cell plate layer 94 comprises an electrically conductive material, such as polysilicon doped to concentration of greater than $1 \times 10^{19}$ ions/$cm^3$. Layers 92 and 94 may be formed by conventional methods.

The provision of layers 92 and 94 forms a first capacitor structure 100 and a second capacitor structure 102. First capacitor structure 100 comprises storage node 81, dielectric layer 92 and cell plate layer 94. Second capacitor 102 comprises storage node 83 dielectric layer 92 and cell plate layer 94.

After formation of layers 92 and 94, a patterned photoresist layer 96 is formed over openings 72 and 74, leaving an exposed area 98 within fifth opening 84 and over node 27.

Figure 12:
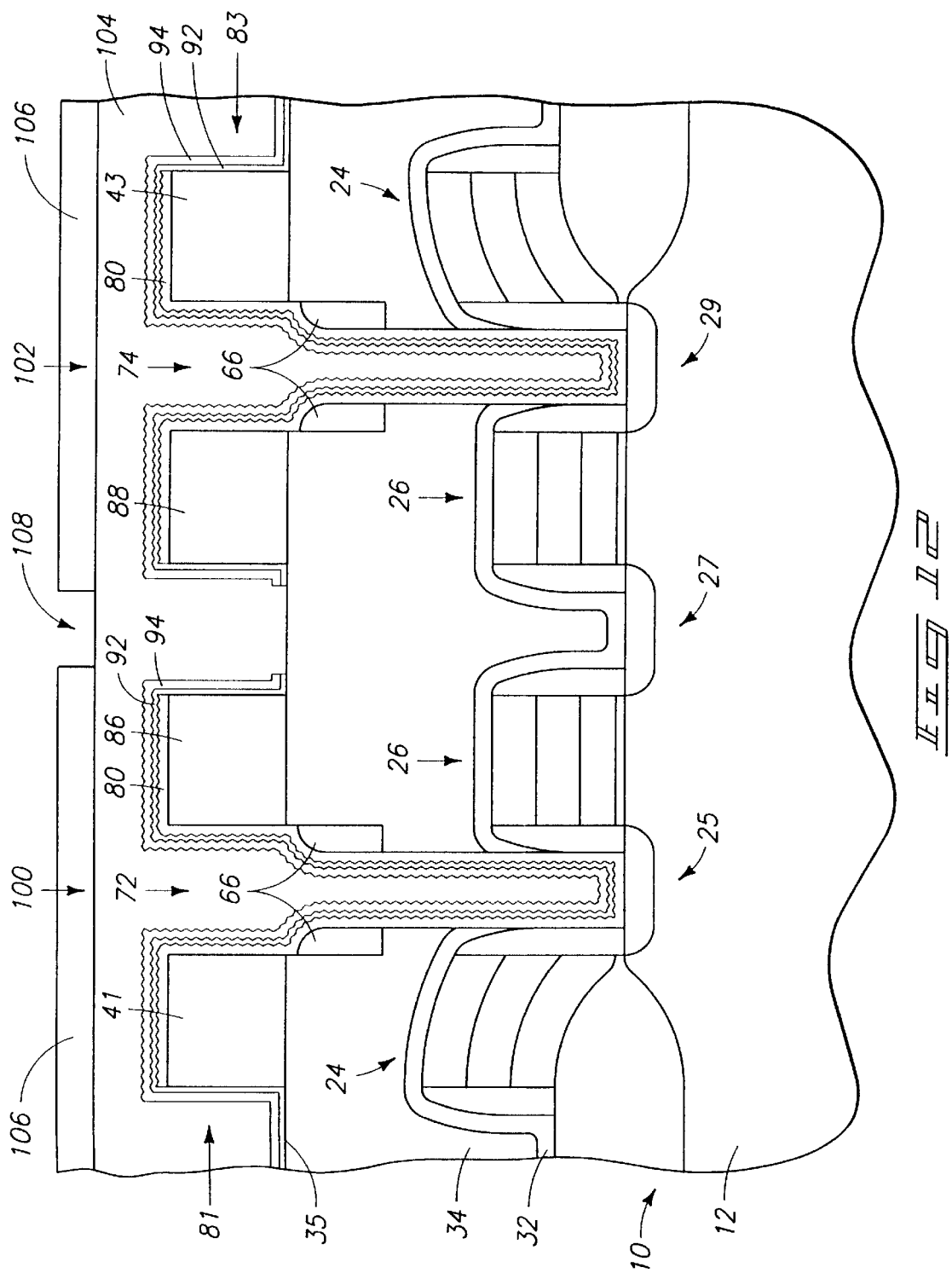
FIG. 12 is a view of the FIG. 1 wafer fragment at a processing step subsequent to that of FIG. 11.

Referring to FIG. 12, exposed portions of cell plate layer 94 and dielectric layer 92 within area 98 are removed.

After removal of the exposed portions of cell plate layer 94 and dielectric layer 92, photoresist blocks 96 are removed and an insulative layer 104 is formed atop wafer fragment 10. Subsequently, patterned photoresist layer 106 is formed over insulative layer 104, leaving an exposed gap 108 over node 27.

Figure 13:
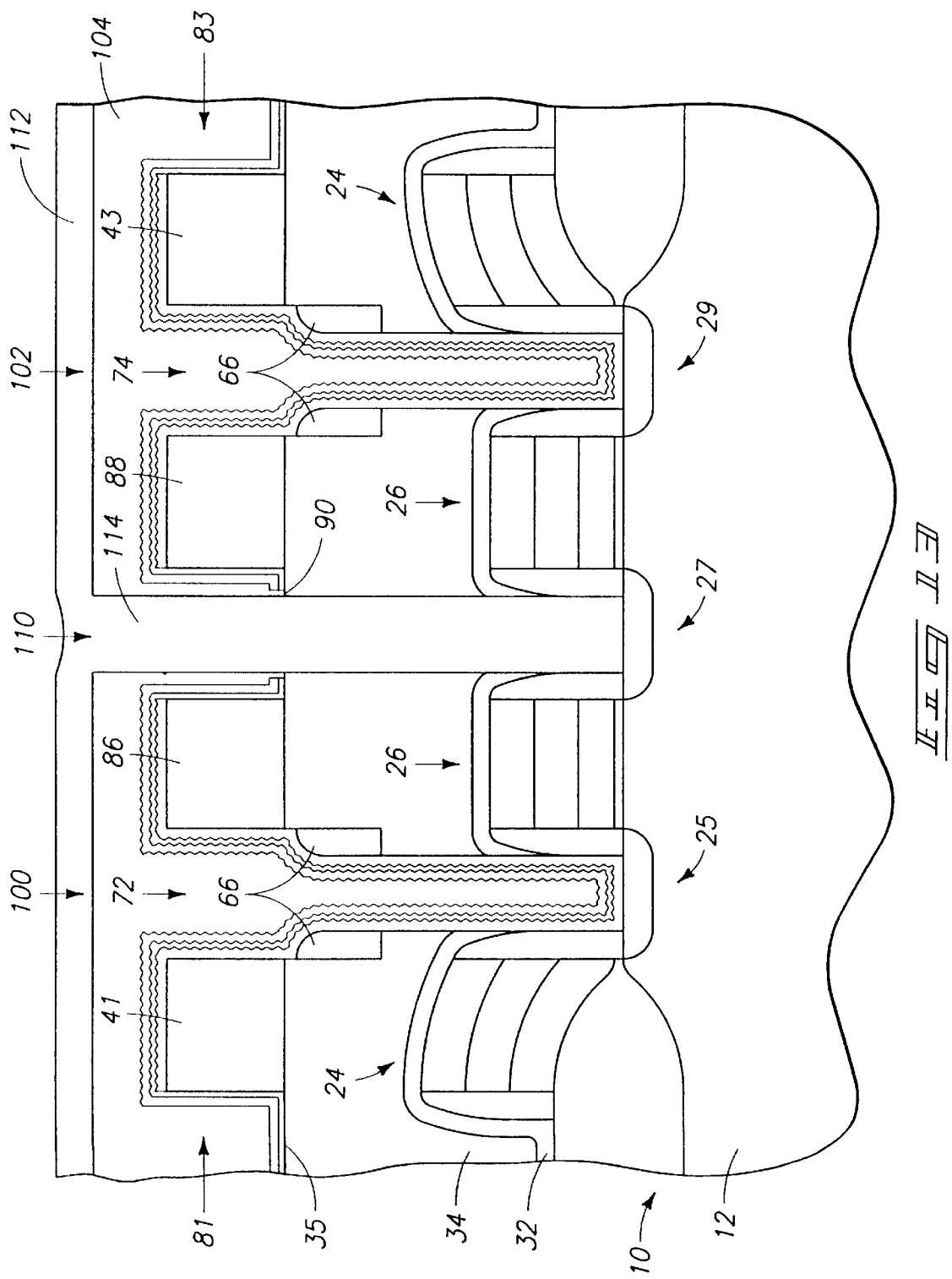
FIG. 13 is a view of the FIG. 1 wafer fragment at a processing step subsequent to that of FIG. 12.
Figure 11:
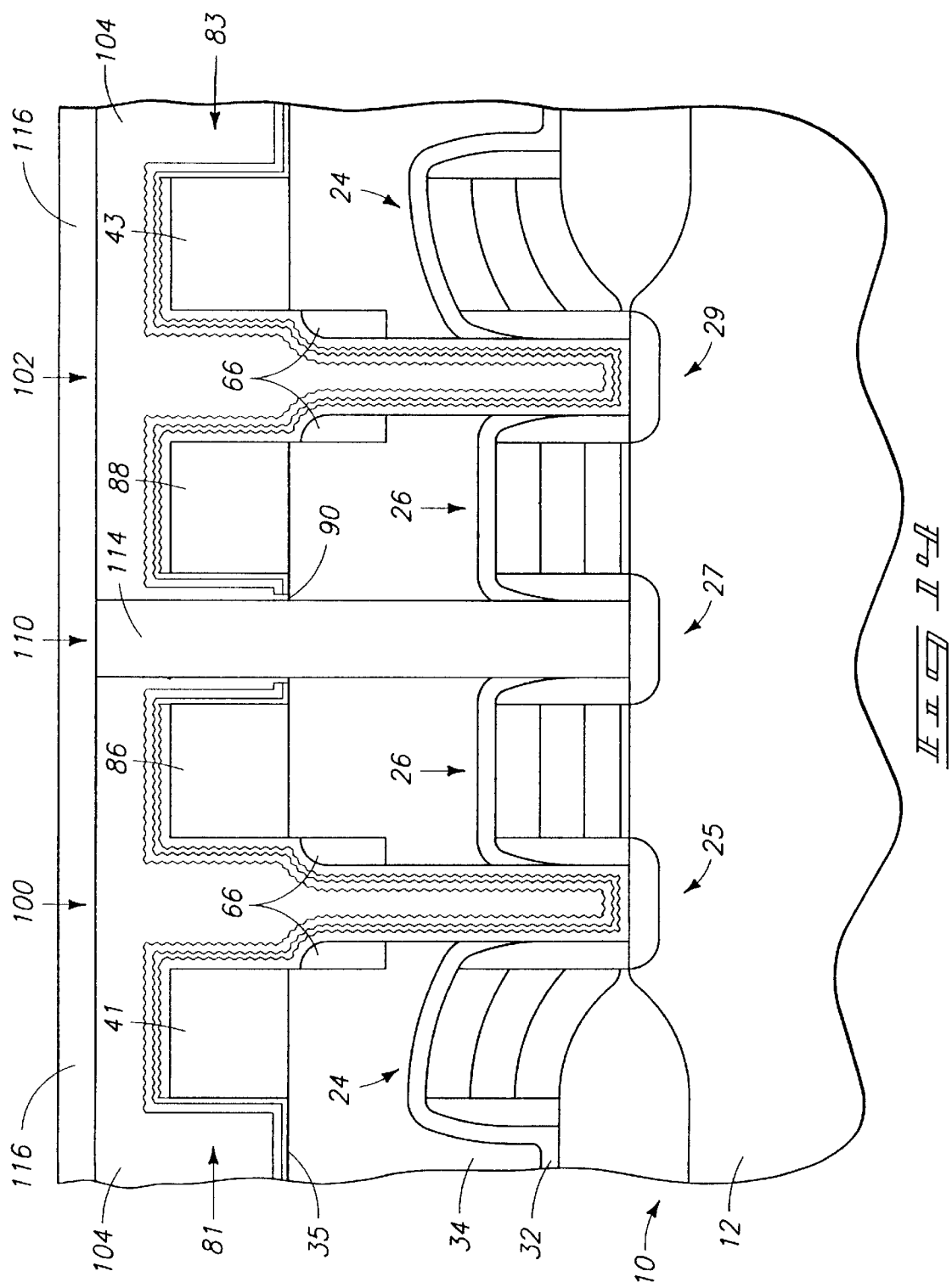

Referring to FIG. 13, a bitline contact opening 110 is etched through insulative layer 104, through layer 34, through oxide 32, and to node 27.

After formation of bitline contact opening 110, photoresist layer 106 (shown in FIG. 12) is removed and a bitline contact layer 112 is formed over insulative material layer 104 and within opening 110. The portion of bitline contact material 112 within opening 110 forms a bitline contact 114.

Bitline contact layer 112 comprises a conductive material, such as tungsten. Methods for forming layer 112 are known to persons of ordinary skill in the art, and include, for example, sputter deposition of tungsten.

Referring to FIG. 14, bitline contact layer 112 is removed from over insulative layer 104, and a bitline 116 is formed over layer 104 and in electrical contact with bitline contact 114. Bitline 116 preferably comprises a conductive material, such as aluminum, and may be formed by conventional methods.

The structure shown in FIG. 14 comprises a DRAM array including capacitors 100 and 102 electrically connected through transistor gates 26 to bitline contact 114 and ultimately to bitline 116. The DRAM array of FIG. 14 actually comprises two DRAM cell structures, with capacitor 100 and a transistor gate 26 comprising a first DRAM cell structure; and capacitor 102 and a transistor gate 26 comprising a second DRAM cell structure.

A second embodiment method of the present invention is described with reference to FIGS. 15 and 16. In the embodiment of FIGS. 15–16, similar numbering to that of the embodiment of FIGS. 1–14 is utilized, with differences indicated by the suffix "a", or by different numbers.

Figure 15:
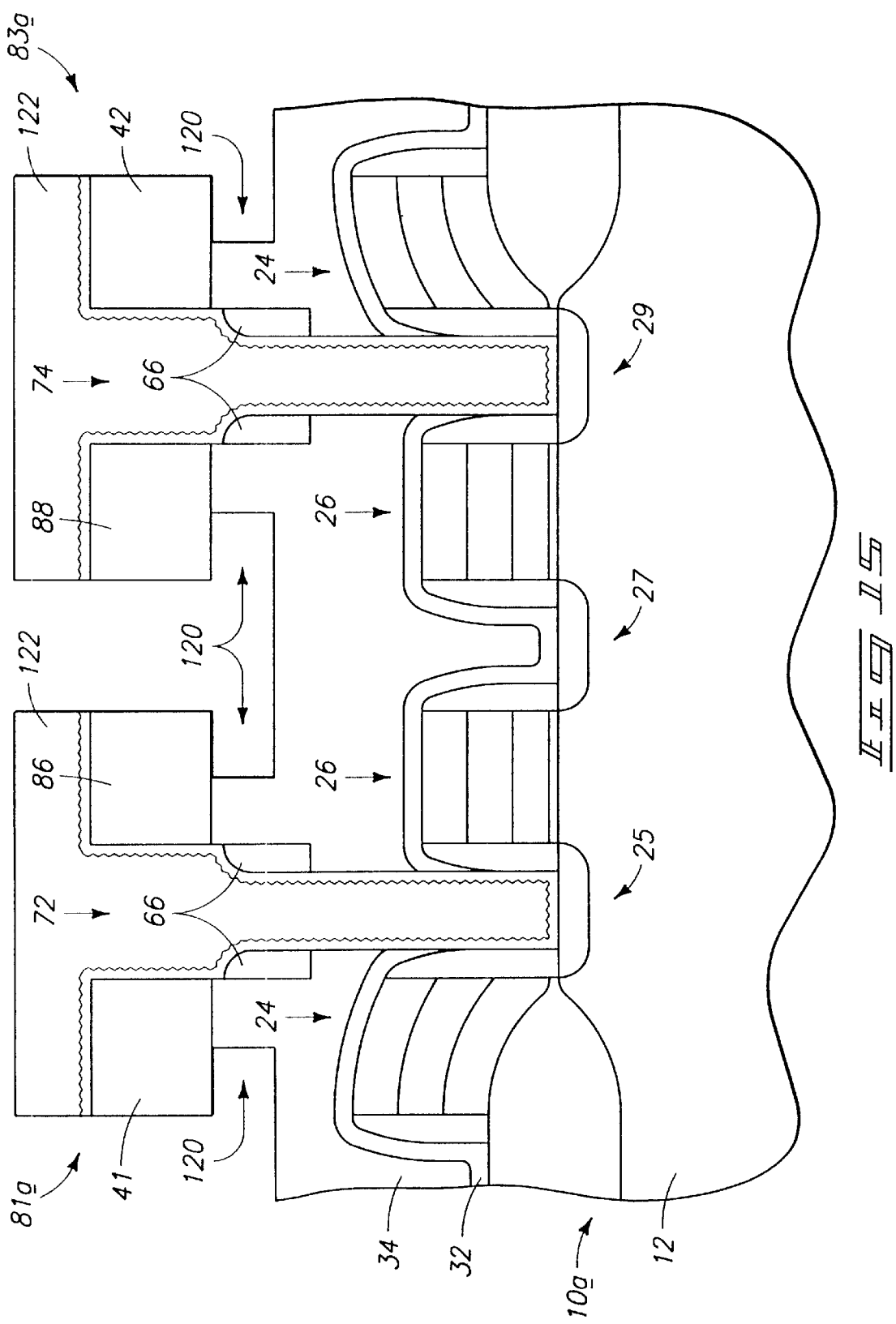
FIG. 15 is a view of the FIG. 1 wafer fragment at a processing step subsequent to that of FIG. 10 processed according to a second embodiment of the present invention.

Referring to FIG. 15, a wafer fragment 10a is shown at a step subsequent to the processing step of FIG. 10. A patterned photoresist layer 122 is formed over and within capacitor openings 72 and 74. Unlike the embodiment of FIGS. 1–14, the embodiment of FIG. 15 comprises cavities 120 etched into layer 34, under segments 41 and 43, and under portions 86 and 88. Methods of forming cavities 120 are known to persons of ordinary skill in the art. An example process of forming cavities 120 in a BPSG layer 34 is a wet isotropic etch of oxide selective to polysilicon. Such etch undercuts beneath polysilicon segments 41 and 43, and beneath polysilicon portions 86 and 88.

Figure 16:
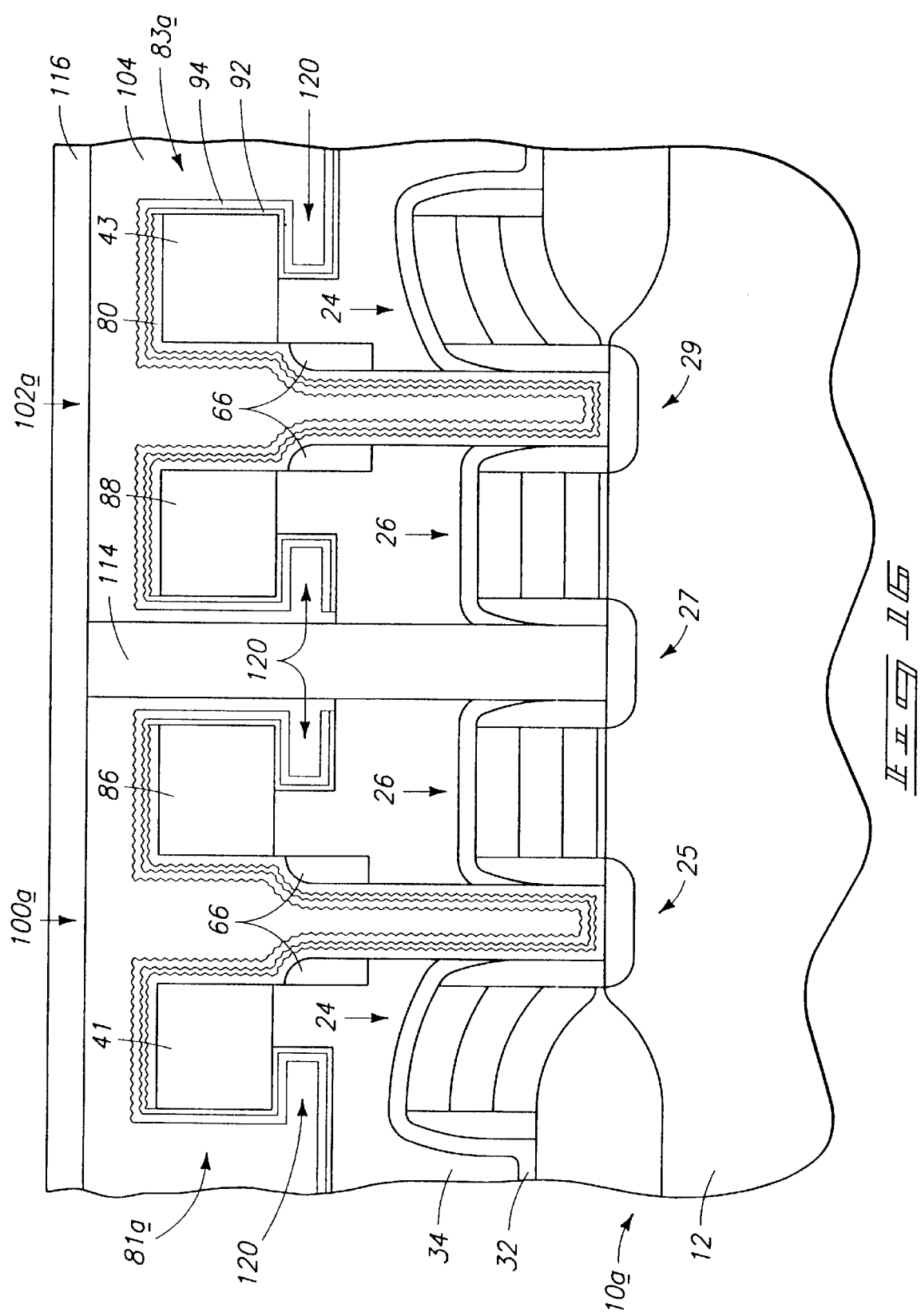
FIG. 16 is a view of the FIG. 1 wafer fragment at a processing step subsequent to that of FIG. 15.

Referring to FIG. 16, the FIG. 15 wafer segment is illustrated after subsequent processing analogous to the processing of FIGS. 11–14. Specifically, a dielectric layer 92 and cell plate layer 94 are provided within capacitor openings 72 and 74 (shown in FIG. 15), over masking layer segments 41 and 43, over portions 86 and 88, and within cavities 120 to form capacitor structures 100a and 102a. An insulative lay4er 104 and a bitline 116 are formed over capacitor structures 100a and 102a, and a bitline contact 114 is formed between capacitor structures 100a and 102a. A first storage node 81a comprises storage node layer 80, segment 41 and portion 86. A second storage node 83a comprises storage node layer 80, segment 43 and portion 88.

The capacitors 100a and 102a of FIG. 16 advantageously differ from the capacitors 100 and 102 of FIG. 14 in that dielectric layer 92 and cell plate layer 94 wrap around storage nodes 81a and 83a, and within cavities 120. Accordingly, the capacitive area of capacitors 100a and 102a is increased relative to the capacitive area of capacitors 100 and 102 of FIG. 14.

A third embodiment of the invention is described with reference to FIGS. 17–22. In the embodiment of FIGS. 17–22, similar numbering to that of the embodiment of FIGS. 1–14 is utilized, with differences indicated by the suffix "b", or by different numbers.

Figure 17:
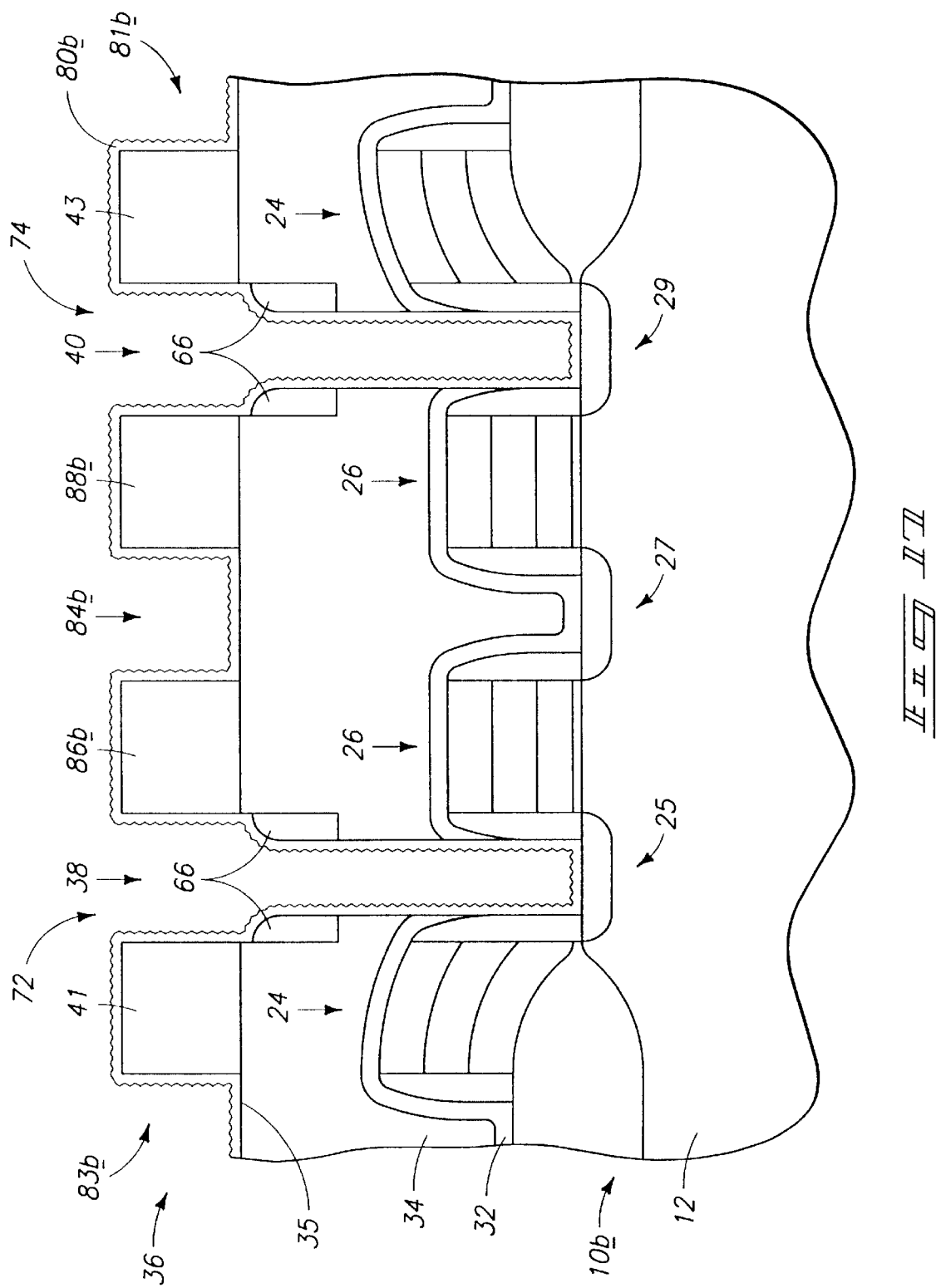
FIG. 17 is a view of the FIG. 1 wafer fragment at a processing step subsequent to that of FIG. 8 processed according to a third embodiment of the present invention.

Referring to FIG. 17, a wafer fragment 10b is shown at a processing step subsequent to that of FIG. 8. A fifth opening 84b is formed over electrical node 27, dividing segment 42 (shown in FIG. 8) into portions 86b and 88b. Note that the embodiment of FIGS. 17–22 differs from that of FIGS. 1–14 in that fifth opening 84b (shown in FIG. 17) is formed prior to deposition of storage node layer 80b, while fifth opening 84 (shown in FIG. 10) is formed after deposition of storage node layer 80b. After formation of fifth opening 84b, a rugged polysilicon storage node layer 80b is formed over segments 41 and 43, over portions 86b and 88b, and over upper surface 35 of insulative layer 34, as well as within capacitor openings 72 and 74. A first storage node 81b comprises storage node layer 80b, segment 41 and portion 86b. A second storage node 83b comprises storage node layer 80b, segment 43 and portion 88b.

Figure 18:
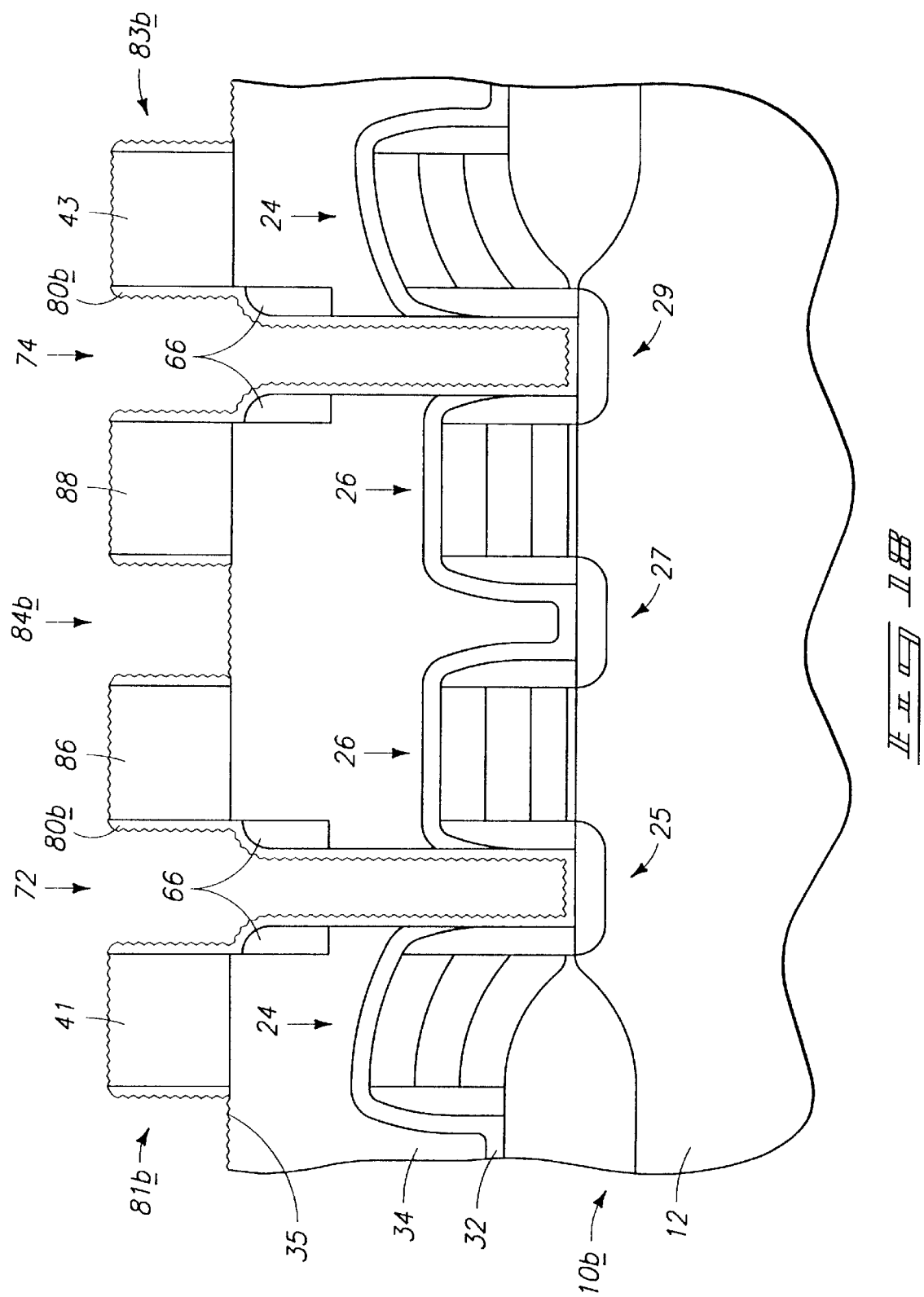
FIG. 18 is a view of the FIG. 1 wafer fragment at a processing step subsequent to that of FIG. 17.

Referring to FIG. 18, polysilicon layer 80b is subjected to an anisotropic dry or wet etch. Such etch removes layer 80b from over segments 41 and 43, portions 86b and 88b, and upper surface 35 of layer 34. Also, the etch transfers roughness from rugged polysilicon layer 80b to upper surface 35, upper surfaces of segments 41 and 43, and upper surfaces of portions 86b and 88b. Removal of layer 80b from upper surface 35 in gap 84b electrically isolates portion 86b from portion 88b, and thus isolates storage node 81b from storage node 83b.

Figure 19:
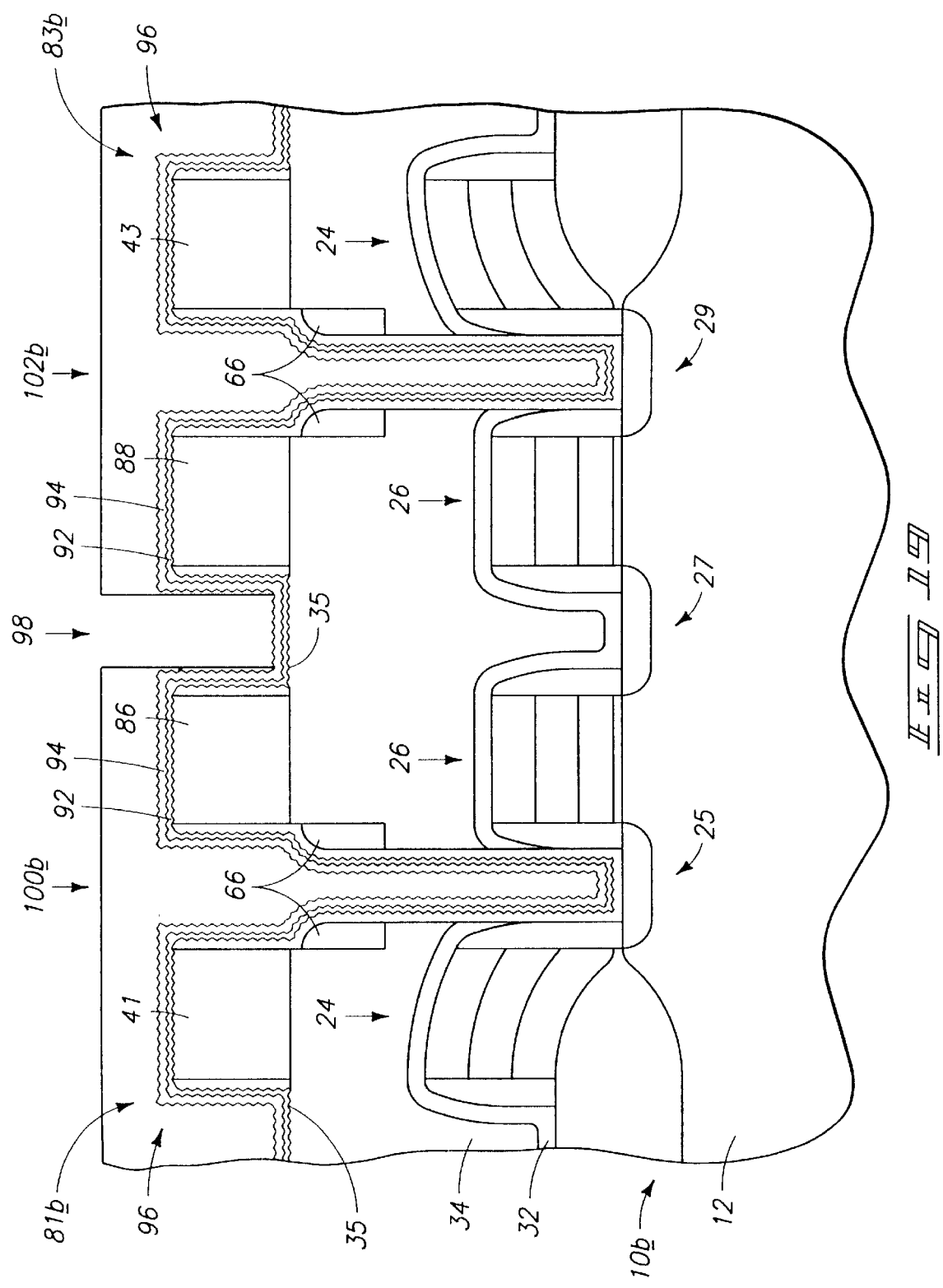
FIG. 19 is a view of the FIG. 1 wafer fragment at a processing step subsequent to that of FIG. 18.

Referring to FIG. 19, a dielectric layer 92 and cell plate layer 94 are provided over storage nodes 81b and 83b, and over upper surface 35 of layer 34. Storage node 81b, dielectric layer 92, and cell plate layer 94 together comprise a capacitor construction 100b. Similarly, storage node 83b, dielectric layer 92 and cell plate layer 94 together comprise a capacitor construction 102b.

A patterned photoresist layer 96 is provided over layers 92 and 94. Patterned photoresist 96 comprises a gap over node 27 and within fifth opening 84b (shown in FIG. 18) leaving an exposed area 98 over electrical node 27.

Figure 20:
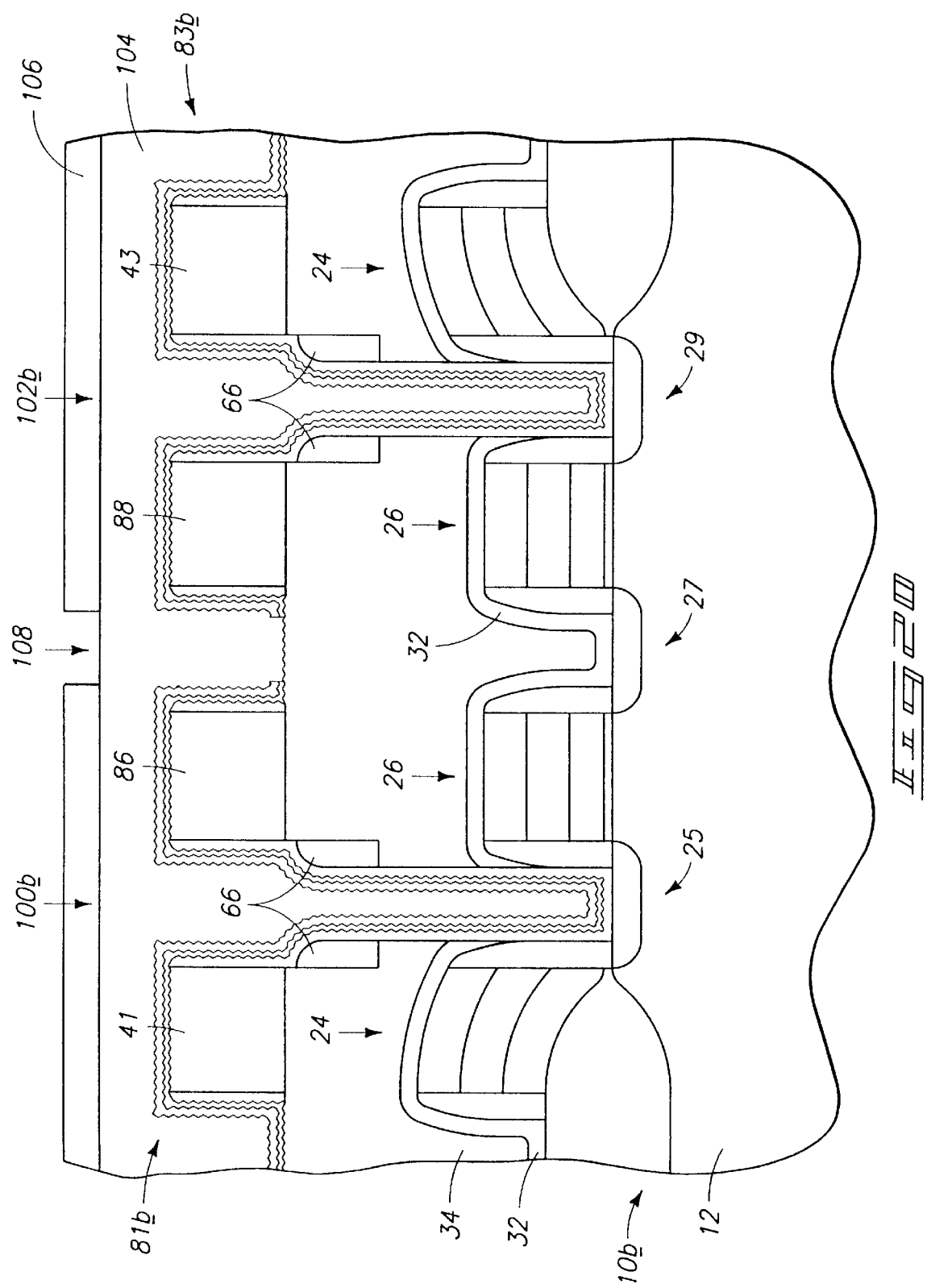
FIG. 20 is a view of the FIG. 1 wafer fragment at a processing step subsequent to that of FIG. 19.

Referring to FIG. 20, cell plate layer 94 and dielectric layer 92 are removed from exposed area 98 (shown in FIG. 19). Subsequently, an insulative layer 104 is formed over capacitor structures 100b and 102b. A patterned photoresist layer 106 is formed over insulative layer 104, leaving a gap 108 over electrical node 27.

Figure 21:
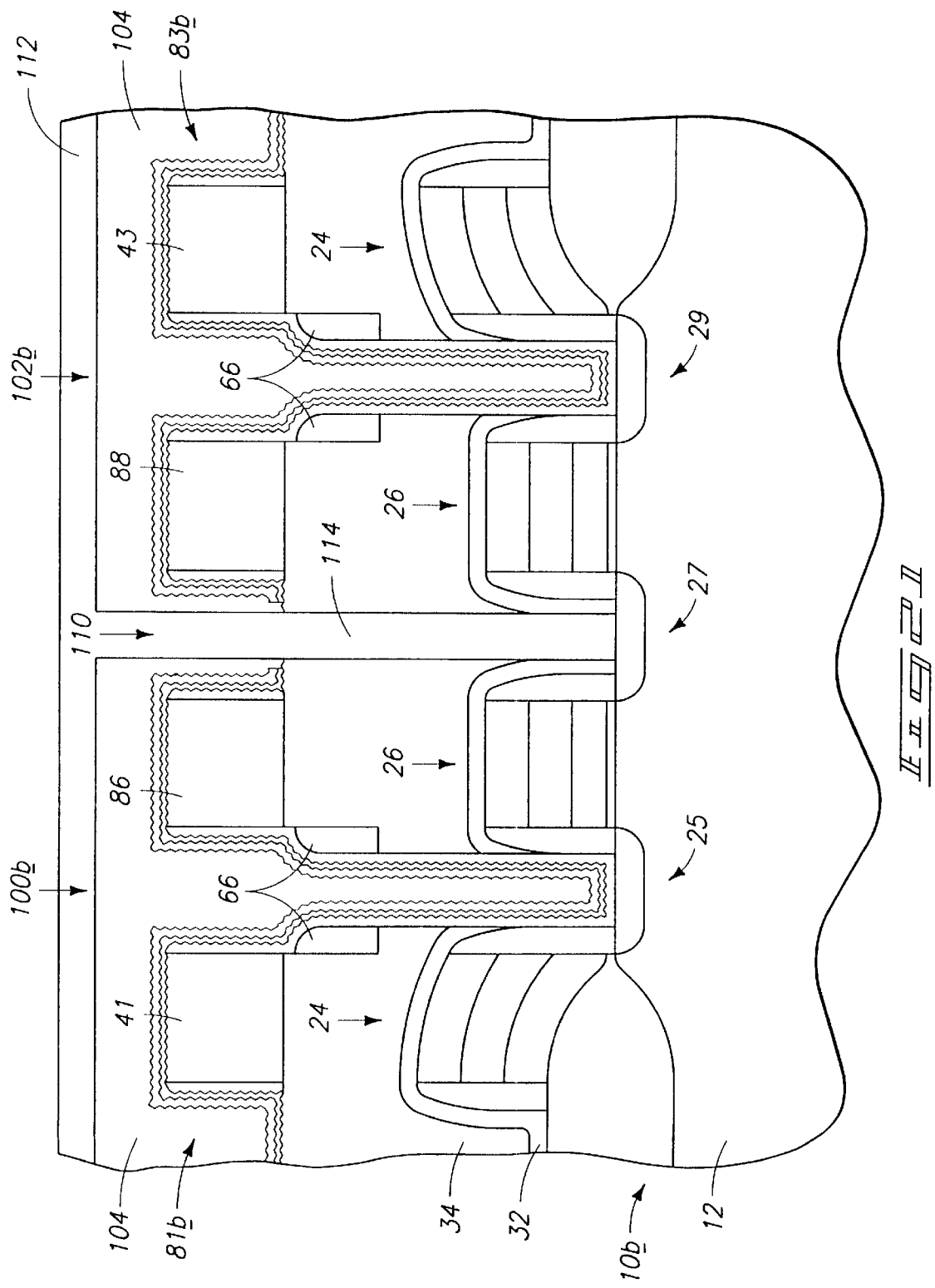
FIG. 21 is a view of the FIG. 1 wafer fragment at a processing step subsequent to that of FIG. 20.

Referring to FIG. 21, layers 104, 34 and 32 are etched through gap 108 to form a bitline contact opening 110 extending through layers 104, 34 and 32 to electrical node 27. After formation of bitline contact opening 110, a bitline contact layer 112 is formed over layer 104 and within opening 110. A portion of bitline contact layer 112 within opening 110 is a bitline contact 114.

Figure 22:
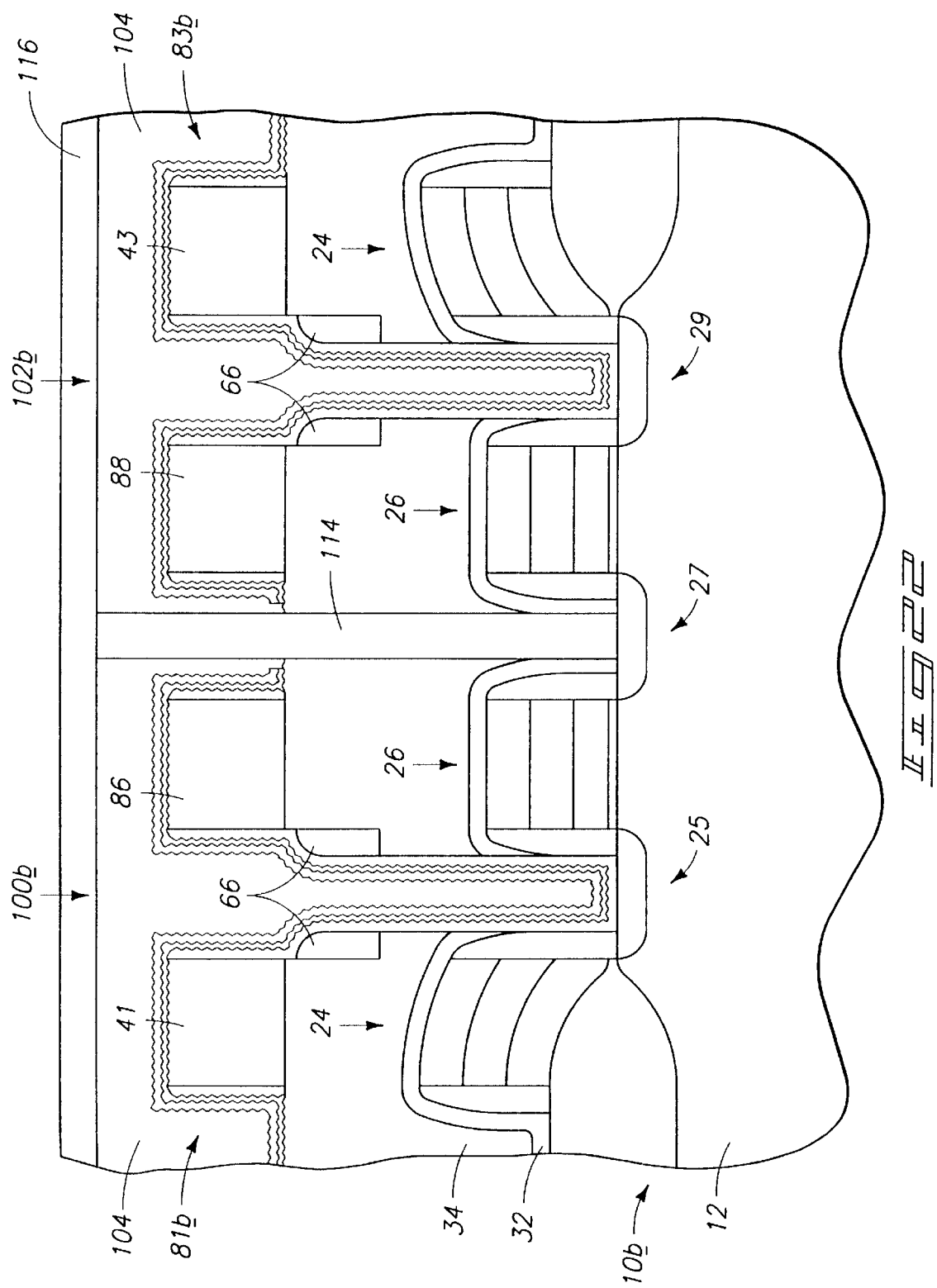
FIG. 22 is a view of the FIG. 1 wafer fragment at a processing step subsequent to that of FIG. 22.

Referring to FIG. 22, bitline contact layer 112 is removed from over layer 104. Subsequently, a bitline 116 is formed over layer 104 and in electrical contact with bitline contact 114.

A fourth embodiment of the method of the present invention is described with reference to FIGS. 23–25. The fourth embodiment is effectively a combination of the second and third embodiments described above. Identical numbering is utilized in FIGS. 23–25 as was utilized in FIGS. 1–14, with differences indicated by the suffix "c", or by different numerals.

Figure 23:
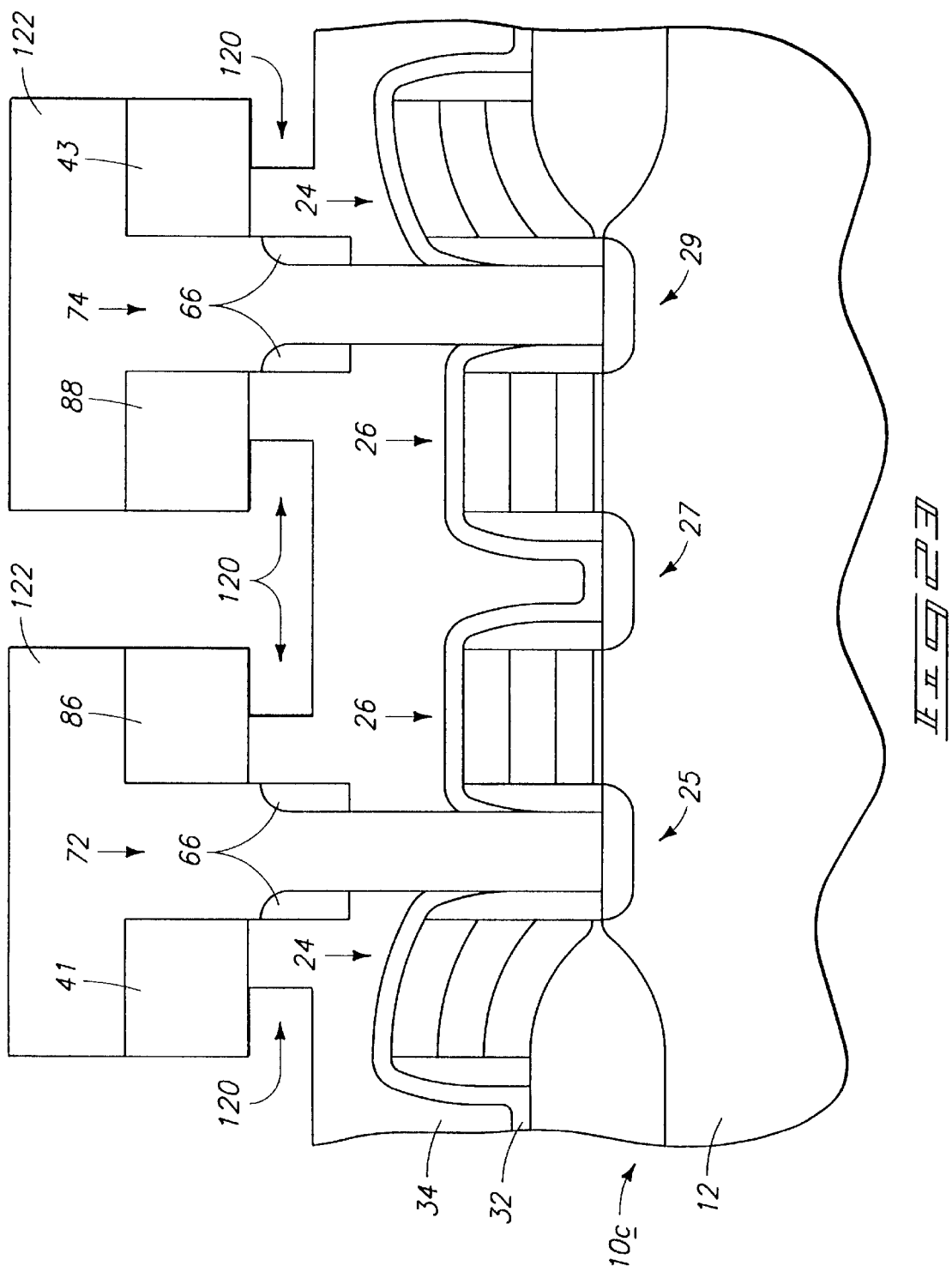
FIG. 23 is a view of the FIG. 1 wafer fragment at a processing step subsequent to that of FIG. 8 processed according to a fourth embodiment of the present invention.

Referring to FIG. 23, wafer fragment 10c is shown at a processing step subsequent to that of FIG. 8. A patterned photoresist layer 122 is formed over and within capacitor openings 72 and 74. Subsequently, cavities 120 are formed beneath the segments 41 and 43, and beneath portions 86 and 88.

Figure 24:
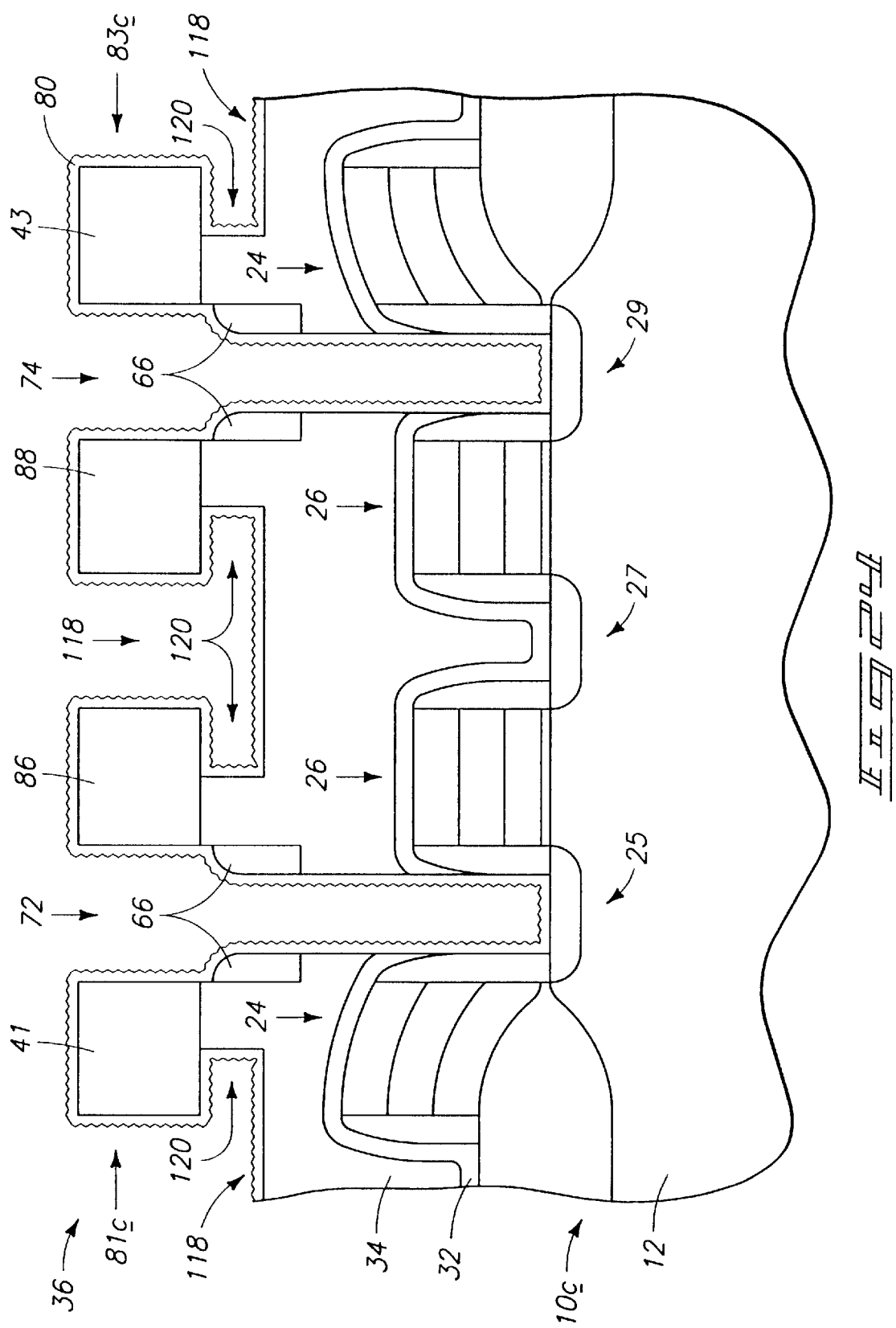
FIG. 24 is a view of the FIG. 1 wafer fragment at a processing step subsequent to that of FIG. 23.

Referring to FIG. 24, photoresist layer 122 is removed and storage node layer 80 is formed over segments 41 and 43, over portions 86 and 88, within capacitor openings 72 and 74, and within cavities 120. A first storage node 81c comprises storage node layer 80, segment 41 and portion 86. A second storage node 83c comprises storage node layer 80, segment 43 and portion 88.

Figure 25:
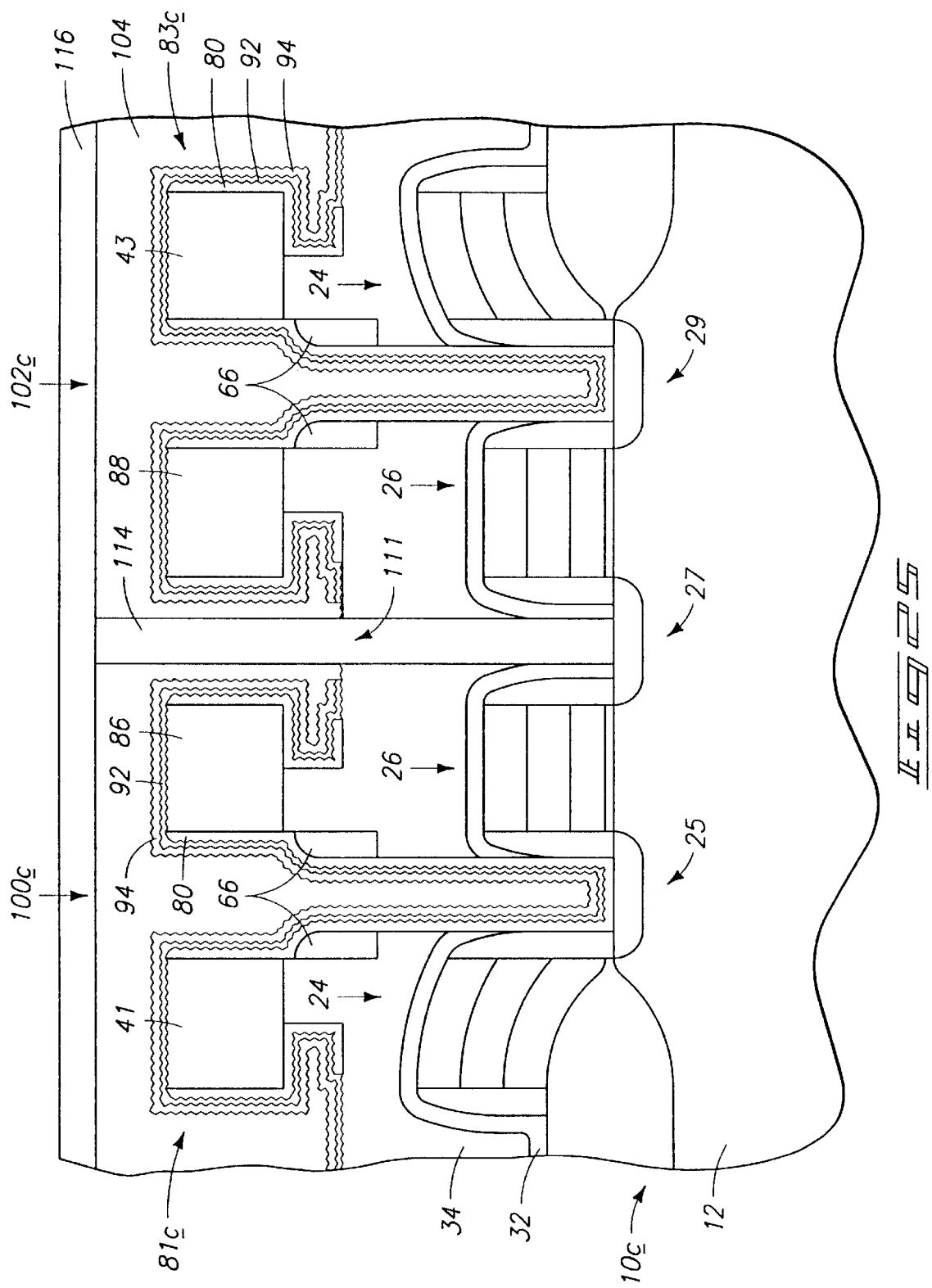
FIG. 25 is a view of the FIG. 1 wafer fragment at a processing step subsequent to that of FIG. 24.

Referring to FIG. 25, subsequent processing analogous to that of FIGS. 9–14 has occurred to form capacitor structures 100c and 102c, bitline contact 114, and bitline 116.

The above-described DRAMs and capacitors of the present invention can be implemented into monolithic integrated circuitry, including microprocessors.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising the following steps:

forming a first layer over a node location;

forming a semiconductive masking layer over the first layer;

etching an opening through both the semiconductive masking layer and the first layer to the node location using the semiconductive masking layer as an etch mask during said etching of said first layer;

forming an upwardly open capacitor storage node layer within the opening and in electrical connection with the masking layer, the storage node layer having a layer thickness over the node location approximately the same as a layer thickness over the masking layer;

patterning at least the masking layer and forming a capacitor storage node comprising the semiconductive masking layer and the storage node layer;

forming a capacitor dielectric layer operatively proximate the capacitor storage node; and forming an outer layer capacitor plate layer operatively proximate the capacitor dielectric layer.

2. The method of claim 1 wherein the semiconductive masking layer comprises polysilicon.

3. The method of claim 1 wherein the node location ultimately comprises a diffusion region in a semiconductive substrate.

4. A method of forming a monolithic integrated circuit comprising the following steps;

fabricating circuitry over a portion of a semiconductor substrate, the integrated circuitry comprising transistors, capacitors and resistive elements;

the fabrication of at least one of the capacitors comprising the following steps:

forming a first layer over a node location;

forming a semiconductor masking layer over the first layer;

etching an opening through both the semiconductive masking layer and the first layer to the node location using the semiconductive masking layer as an etch mask during said etching of said first layer;

forming an upwardly open capacitor storage node layer within the opening and in electrical connection with the masking layer, the storage node layer having a layer thickness over the node location approximately the same as a layer thickness over the masking layer;

pattering at least the masking layer and forming a capacitor storage node comprising the semiconductor masking layer and the storage node layer;

forming a capacitor dielectric layer operatively proximate the capacitor storage node; and forming an outer capacitor plate layer operatively proximate the capacitor dielectric layer.

5. The method of claim 4 wherein the integrated circuit is fabricated as part of a microprocessor circuit.

6. The method of claim 4 wherein the integrated circuit is fabricated as part of a microprocessor circuit and wherein the at least one capacitor is incorporated into a DRAM cell.

7. The method according to claim 1 wherein the forming the capacitor dielectric layer and the forming the outer capacitor plate layer, comprise forming the respective layer to extend at least partially into the opening.

8. The method according to claim 1 wherein the forming the capacitor dielectric layer comprises forming the layer to extend substantially the entire length of the opening.

9. The method according to claim 4 wherein the forming the capacitor dielectric layer and the forming the outer capacitor plate layer, comprise forming the layer to extend at least partially into the opening.

10. The method according to claim 4 wherein the forming the capacitor dielectric layer comprises forming the layer to extend substantially the entire length of the opening.

11. The method according to claim 1 wherein the forming the semiconductor masking layer comprises forming an undoped polysilicon masking layer.

12. The method according to claim 4 wherein the forming the semiconductor masking layer comprises forming an undoped polysilicon masking layer.

13. The method according to claim 1 further comprising forming a spacer within the opening, the spacer having an upper surface elevationally lower than a bottom surface of the semiconductor masking layer and being in electrical connection with the storage node layer.

14. The method according to claim 4 further comprising forming a spacer within the opening, the spacer having an upper surface elevationally lower than a bottom surface of the semiconductor masking layer and being in electrical connection with the storage node layer.

* * * * *

UNITED STATES PATENT AND TRADEMARK OFFICE
CERTIFICATE OF CORRECTION

PATENT NO. : 6,376,301 B2
DATED : April 23, 2002
INVENTOR(S) : Kunal R. Parekh et al.

It is certified that error appears in the above-identified patent and that said Letters Patent is hereby corrected as shown below:

Title page,
Item [56], References Cited, replace "5,438,011" with -- 5,438,041 --.

Column 7,
Line 16, replace "lay4er" with -- layer --.
Line 20, replace "83acomprises" with -- 83a comprises --.

Column 9,
Line 24, delete the first occurrence of the word "layer" after the word -- outer --.

Column 10,
Lines 31, 34, 39 and 44, replace "semiconductor" with -- semiconductive --.

Signed and Sealed this

Tenth Day of December, 2002

JAMES E. ROGAN
*Director of the United States Patent and Trademark Office*